US012666975B2

(12) United States Patent
Fujii et al.

(10) Patent No.: US 12,666,975 B2
(45) Date of Patent: Jun. 23, 2026

(54) SEMICONDUCTOR DEVICE

(71) Applicant: ROHM CO., LTD., Kyoto (JP)

(72) Inventors: Kenji Fujii, Kyoto (JP); Akinori Nii, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 826 days.

(21) Appl. No.: 17/798,532

(22) PCT Filed: Feb. 17, 2021

(86) PCT No.: PCT/JP2021/005922
§ 371 (c)(1),
(2) Date: Aug. 9, 2022

(87) PCT Pub. No.: WO2021/177034
PCT Pub. Date: Sep. 10, 2021

(65) Prior Publication Data
US 2023/0090494 A1 Mar. 23, 2023

(30) Foreign Application Priority Data

Mar. 3, 2020 (JP) ................................. 2020-035735

(51) Int. Cl.
H10W 70/40 (2026.01)
H10W 72/00 (2026.01)
(Continued)

(52) U.S. Cl.
CPC ....... H10W 70/421 (2026.01); H10W 70/424 (2026.01); H10W 74/111 (2026.01);
(Continued)

(58) Field of Classification Search
CPC ......... H10W 70/421–438; H10W 70/464–468; H10W 90/811
See application file for complete search history.

(56) References Cited

U.S. PATENT DOCUMENTS 7,064,009 B1 * 6/2006 McCann ................. H01L 24/17
438/123
2004/0195687 A1 * 10/2004 Inoue .................... H01L 23/295
257/E23.129
(Continued)

FOREIGN PATENT DOCUMENTS

JP 5-62977 A 3/1993
JP 6-37093 A 2/1994
(Continued)

OTHER PUBLICATIONS

International Search Report issued in PCT/JP2021/005922, May 25, 2021 (2 pages).
(Continued)

*Primary Examiner* — Julio J Maldonado
*Assistant Examiner* — Pinaki Das
(74) *Attorney, Agent, or Firm* — HSML P.C.

(57) ABSTRACT

A semiconductor device includes a conductor, a semiconductor element, and a bonding layer. The conductor has obverse surfaces and reverse surfaces facing away from each other in a thickness direction. The semiconductor element has a body layer and electrodes projecting toward the obverse surfaces from a side of the body layer that opposes the obverse surfaces in the thickness direction. The bonding layer bonds the obverse surfaces and the electrodes. Each electrode has a base portion in contact with the body layer and a columnar portion projecting from the base portion and in contact with the bonding layer. The electrodes include a first electrode and a second electrode located closer to the periphery of the body layer than is the first electrode as viewed in the thickness direction. The second electrode is larger in area of the columnar portion than the first electrode, as viewed in the thickness direction.

12 Claims, 15 Drawing Sheets

(51) Int. Cl.
    *H10W 72/20*       (2026.01)
    *H10W 72/90*       (2026.01)
    *H10W 74/10*       (2026.01)
    *H10W 90/00*       (2026.01)

(52) U.S. Cl.
    CPC ........ *H10W 70/435* (2026.01); *H10W 70/438*
    (2026.01); *H10W 70/464* (2026.01); *H10W*
    *70/465* (2026.01); *H10W 72/07252* (2026.01);
    *H10W 72/07253* (2026.01); *H10W 72/227*
    (2026.01); *H10W 72/228* (2026.01); *H10W*
    *72/231* (2026.01); *H10W 72/234* (2026.01);
    *H10W 72/252* (2026.01); *H10W 72/923*
    (2026.01); *H10W 72/952* (2026.01); *H10W*
    *90/724* (2026.01); *H10W 90/811* (2026.01)

(56) References Cited

U.S. PATENT DOCUMENTS

| | | | | |
|---|---|---|---|---|
| 2012/0188735 A1* | 7/2012 | Hiroshima | .............. | H05K 1/18 |
| | | | | 361/767 |
| 2013/0146872 A1* | 6/2013 | Chen | ....................... | H01L 24/10 |
| | | | | 257/E23.01 |
| 2013/0334662 A1* | 12/2013 | Jackson | ................. | H01L 24/17 |
| | | | | 257/536 |
| 2015/0001704 A1* | 1/2015 | Lu | ........................... | H01L 24/81 |
| | | | | 257/737 |

| | | | | |
|---|---|---|---|---|
| 2015/0097286 A1 | 4/2015 | Suen et al. | | |
| 2015/0262954 A1 | 9/2015 | Lee et al. | | |
| 2016/0372430 A1* | 12/2016 | Arvin | ...................... | H01L 24/13 |
| 2018/0342475 A1* | 11/2018 | Wirz | ....................... | H01L 24/11 |

FOREIGN PATENT DOCUMENTS

| | | | |
|---|---|---|---|
| JP | 10-12620 A | 1/1998 |
| JP | 11-340352 A | 12/1999 |
| JP | 2003-37129 A | 2/2003 |
| JP | 2003-297868 A | 10/2003 |
| JP | 2005-123247 A | 5/2005 |
| JP | 2006-324320 A | 11/2006 |
| JP | 2010-98098 A | 4/2010 |
| JP | 2018-85522 A | 5/2018 |

OTHER PUBLICATIONS

Office Action issued in corresponding Japanese Patent application No. 2022-505107, Oct. 1, 2024, and machine translation (11 pages).
Office Action issued in corresponding Chinese Patent application No. 202180018565.0, Jun. 25, 2025, and machine translation (15 pages).
Office Action issued in corresponding Chinese Patent application No. 202180018565.0, Apr. 18, 2026, and machine translation (11 pages).

* cited by examiner

SEMICONDUCTOR DEVICE

TECHNICAL FIELD

The present disclosure relates to a semiconductor device with a semiconductor element.

BACKGROUND ART

A semiconductor device with a semiconductor element bonded to a conductor (e.g., a lead) by flip-chip bonding is conventionally known. Patent Document 1 discloses an example of such a semiconductor device.

In the semiconductor device, a plurality of electrodes of the semiconductor element (semiconductor chip in Patent Document 1) are bonded to a conductor (lead-out conductors in Patent Document 1) via a bonding layer (conductive bump in Patent Document 1). The electrodes of the semiconductor element oppose the conductor.

To bond the semiconductor element to the conductor by flip-chip bonding in the manufacture of the semiconductor device, the electrodes of the semiconductor element are first temporarily adhered to the conductor via a bonding layer. Next, the bonding layer is melted by ref lowing. Such ref lowing produces thermal stress in the semiconductor element. This may cause the semiconductor element to warp upward in the thickness direction. When the semiconductor element warps considerably, the contact area between the bonding layer and each of the electrodes located relatively close to the periphery as viewed in the thickness direction becomes smaller. In such a state, the electrical conduction between the electrodes and the conductor, to which the electrodes are bonded, may deteriorate.

TECHNICAL REFERENCE

Patent Document

Patent Document 1: JP-A-2018-85522

SUMMARY OF THE INVENTION

Problems to be Solved by the Invention

In light of the above circumstances, an object of the present disclosure is to provide a semiconductor device capable of reducing the warp of a semiconductor element that is flip-chip bonded.

Means for Solving the Problems

A semiconductor device provided according to the present disclosure includes: a conductor having obverse surfaces and reverse surfaces facing away from each other in a thickness direction; a semiconductor element having a body layer and a plurality of electrodes, the plurality of electrodes projecting toward the obverse surfaces from a side of the body layer that opposes the obverse surfaces in the thickness direction; and a bonding layer bonding the obverse surfaces and the plurality of electrodes. Each of the plurality of electrodes has a base portion in contact with the body layer and a columnar portion projecting from the base portion and in contact with the bonding layer. The plurality of electrodes include a first electrode, and a second electrode located closer to the periphery of the body layer than is the first electrode as viewed in the thickness direction. The columnar portion of the second electrode has a larger area than the columnar portion of the first electrode as viewed in the thickness direction.

Preferably, the height of the columnar portion of the second electrode is larger than the height of the columnar portion of the first electrode.

Preferably, the height of the columnar portion of the second electrode is not less than 110% and not more than 120% of the height of the columnar portion of the first electrode.

Preferably, the columnar portion of each of the plurality of electrodes has an end surface opposing a relevant one of the obverse surfaces, and a side surface connected to the end surface and facing in a direction orthogonal to the thickness direction, and the bonding layer is in contact with the end surface and the side surface.

Preferably, the semiconductor element has a surface protective film covering the side of the body layer that opposes the obverse surfaces in the thickness direction, and the end surface of each of the plurality of electrodes is located between the obverse surface and the surface protective film in the thickness direction.

Preferably, the base portion and the columnar portion of each of the plurality of electrodes are in contact with the surface protective film.

Preferably, the columnar portion of at least one of the plurality of electrodes is separated from the surface protective film.

Preferably, the columnar portion of the second electrode is separated from the surface protective film.

Preferably, the columnar portion of each of the plurality of electrodes is formed with a recess that is recessed from the end surface toward the body layer, and the bonding layer is in contact with the recess.

Preferably, the end surface of each of the plurality of electrodes bulges toward the obverse surface.

Preferably, the columnar portion of the second electrode has a curved surface forming a boundary between the end surface and the side surface and bulging toward the outside of the columnar portion.

Preferably, the conductor includes a plurality of first leads and a plurality of second leads. The plurality of first leads are elongated in a first direction orthogonal to the thickness direction and disposed side by side in a second direction orthogonal to the thickness direction and the first direction. The plurality of second leads are located away from the plurality of first leads in the second direction. The body layer includes a semiconductor substrate and a semiconductor layer laminated on a side of the semiconductor substrate that opposes the obverse surfaces in the thickness direction. The semiconductor layer contains a switching circuit and a control circuit electrically connected to the switching circuit. At least one of the plurality of electrodes is electrically connected to the switching circuit and bonded to the obverse surface of one of the plurality of first leads. At least one of the plurality of electrodes is electrically connected to the control circuit and bonded to the obverse surface of one of the plurality of second leads.

Preferably, the semiconductor device further includes a sealing resin covering the semiconductor element, a part of each of the plurality of first leads, and a part of each of the plurality of second leads. The sealing resin has a bottom surface facing a side which the reverse surfaces face in the thickness direction and a pair of first side surfaces connected to the bottom surface and spaced apart from each other in the first direction. Each of the plurality of first leads includes a main section elongated in the first direction and a pair of side sections connected to opposite ends of the main section in the first direction. Each of the pair of side sections has a first end surface connected to a relevant one of the obverse surfaces and a relevant one of the reverse surfaces and facing in the first direction. The reverse surface of each of the plurality of first leads is exposed from the bottom surface. The first end surface of each of the pair of the side sections is exposed from a relevant one of the pair of the first side surfaces to be flush with the first side surface. In each of the plurality of first leads, the dimension of each of the first end surface in the second direction is smaller than the dimension of the reverse surface of the main section in the second direction.

Preferably, in at least one of the plurality of first leads, each of the pair of side sections is formed with a constriction extending from the obverse surface to the reverse surface and recessed from opposite edges in the second direction toward an inside of the side section.

Preferably, in at least one of the plurality of first leads, each of the pair of side sections is formed with an indentation extending from the obverse surface to the reverse surface, recessed from the first end surface in the first direction, and dividing the first end surface into two sections.

Preferably, each of the plurality of second leads has a second end surface connected to the obverse surface and the reverse surface and facing in the second direction. The sealing resin has a pair of second side surfaces connected to the bottom surface and the pair of first side surfaces and spaced apart from each other in the second direction. The reverse surface of each of the plurality of second leads is exposed from the bottom surface. The second end surface of each of the plurality of second leads is exposed from one of the pair of the second side surfaces to be flush with the second side surface.

Preferably, one of the plurality of first leads that is farthest from the plurality of second leads includes a plurality of projections projecting from the main section away from the plurality of second leads in the second direction. Each of the plurality of projections has a sub-end surface connected to the obverse surface and the reverse surface and facing in the second direction. The sub-end surface of each of the plurality of projections is exposed from one of the pair of the second side surfaces to be flush with the second side surface.

Advantages of the Invention

Thus, the semiconductor device according to the present disclosure can reduce the warp of the semiconductor element in the thickness direction during flip-chip bonding in the manufacture of the device.

Other features and advantages of the present disclosure will become apparent from the detailed description given below with reference to the accompanying drawings.

MODE FOR CARRYING OUT THE INVENTION

Modes for carrying out the embodiments of the disclosure are described below with reference to the accompanying drawings.

First Embodiment

Figure 1:
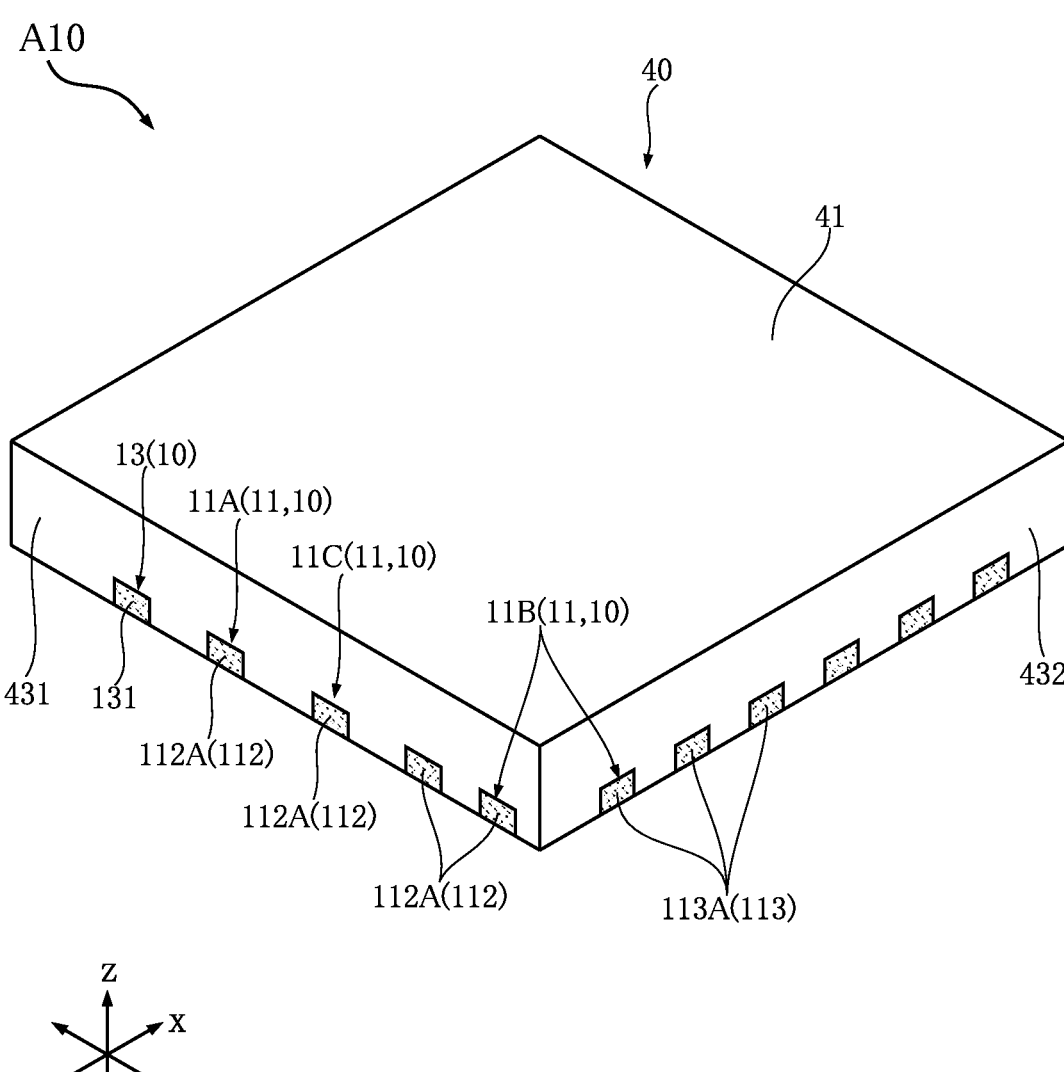
FIG. 1 is a perspective view of a semiconductor device according to a first embodiment of the present disclosure.
Figure 2:
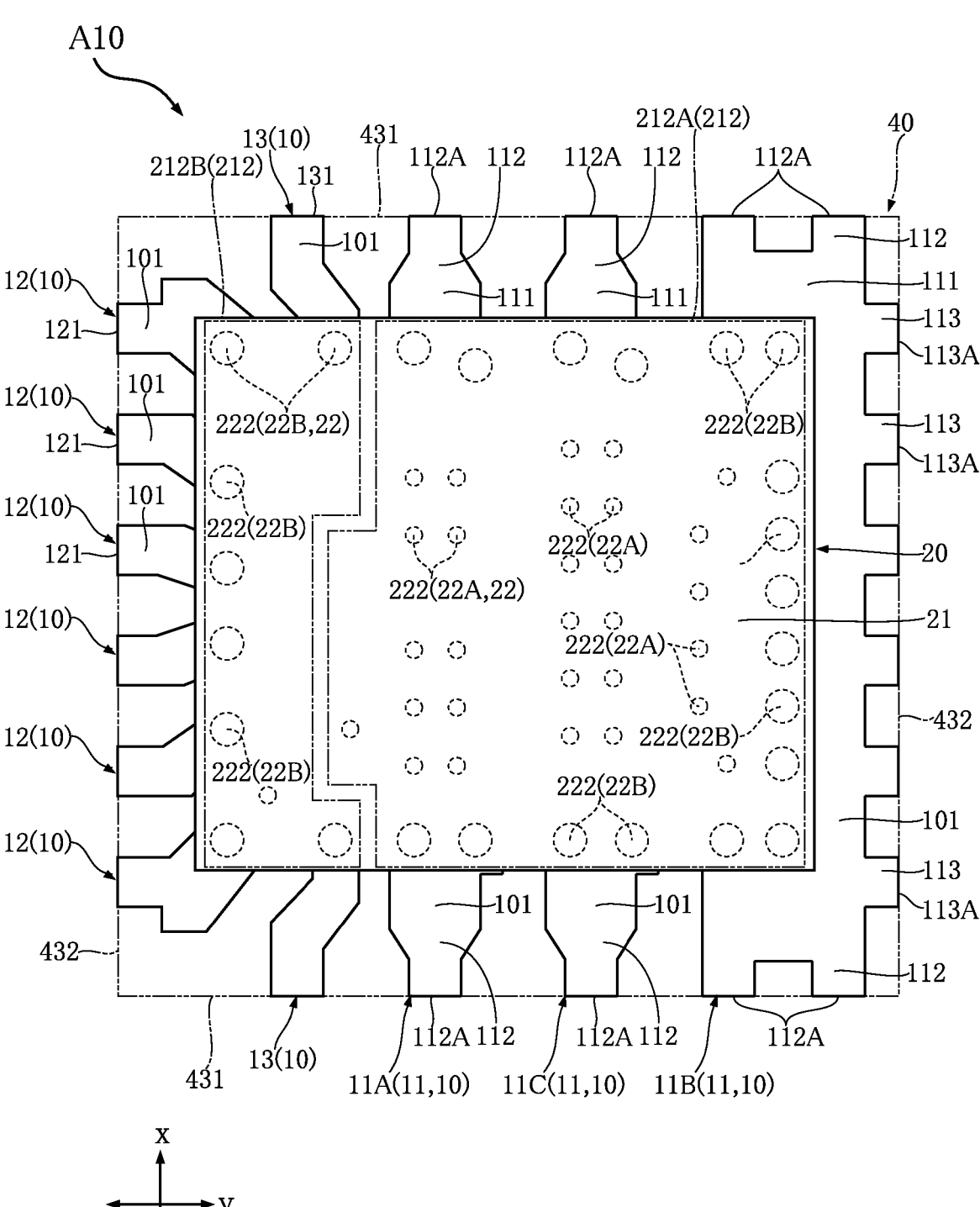
FIG. 2 is a plan view of the semiconductor device shown in FIG. 1, as seen through a sealing resin.
Figure 3:
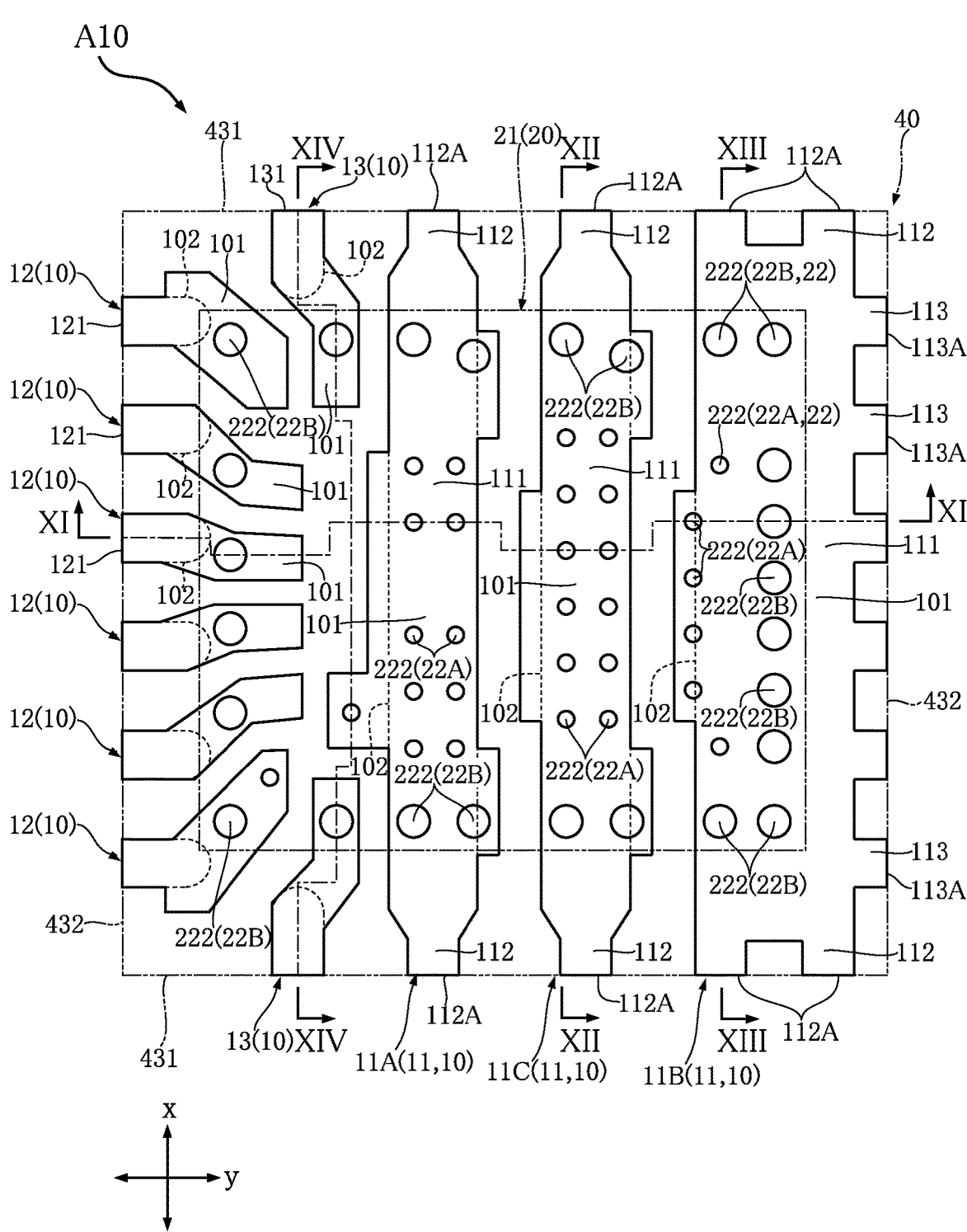
FIG. 3 is a plan view of the semiconductor device corresponding to FIG. 2, in which the semiconductor element is also shown as transparent.

A semiconductor device A10 according to a first embodiment of the present disclosure is described below with reference to FIGS. 1 to 16. The semiconductor device A10 includes a conductor 10, a semiconductor element 20, a bonding layer 30, and a sealing resin 40. As shown in FIG. 1, the package type of the semiconductor device A10 is the QFN (Quad for Non-Lead Package). The semiconductor element 20 is an LSI of a flip-chip type. The semiconductor element 20 contains a switching circuit 212A and a control circuit 212B (both described later). In the semiconductor device A10, the switching circuit 212A convers DC power (voltage) to AC power (voltage). The semiconductor device A10 may be used for an element of a DC/DC converter circuit, for example. In FIG. 2, the sealing resin 40 is shown as transparent, for convenience of understanding. FIG. 3 is a view corresponding to FIG. 2, in which the semiconductor element 20 (excluding columnar portions 222 of electrodes 22 described later) is also shown as transparent, for convenience of understanding. In these figures, the contours of the semiconductor element 20 and the sealing resin 40 shown as transparent are indicated by imaginary lines (two-dot chain lines).

In the description of the semiconductor device A10, the thickness direction of the conductor 10 is referred to as "thickness direction z". A direction orthogonal to the thickness direction z is referred to as "first direction x". The direction orthogonal to both the thickness direction z and the first direction x is referred to as "second direction y". As shown in FIGS. 1 and 2, the semiconductor device A10 is square as viewed in the thickness direction z. In the description of the semiconductor device A10, the side in the second direction y on which a plurality of second leads 12 (described later) are located is referred to as "first side in the second direction y" for convenience. The side in the second direction y on which a plurality of first leads 11 (described later) are located is referred to as "second side in the second direction y".

The conductor 10 supports the semiconductor element 20 as shown in FIG. 2 and also forms terminals for mounting the semiconductor device A10 on a wiring board. As shown in FIGS. 11 to 14, the conductor 10 is partially covered with the sealing resin 40. The conductor 10 has obverse surfaces 101 and reverse surfaces 102 facing away from each other in the thickness direction z. The obverse surfaces 101 face one side in the thickness direction z and oppose the semiconductor element 20. The semiconductor element 20 is supported on the obverse surfaces 101. The obverse surfaces 101 are covered with the sealing resin 40. The reverse surfaces 102 face the other side in the thickness direction z. The conductor 10 is constituted by a single lead frame. The lead frame may be made of a material containing copper (Cu) or a copper alloy, for example. The conductor 10 includes a plurality of first leads 11, a plurality of second leads 12, and a pair of third leads 13.

Figure 4:
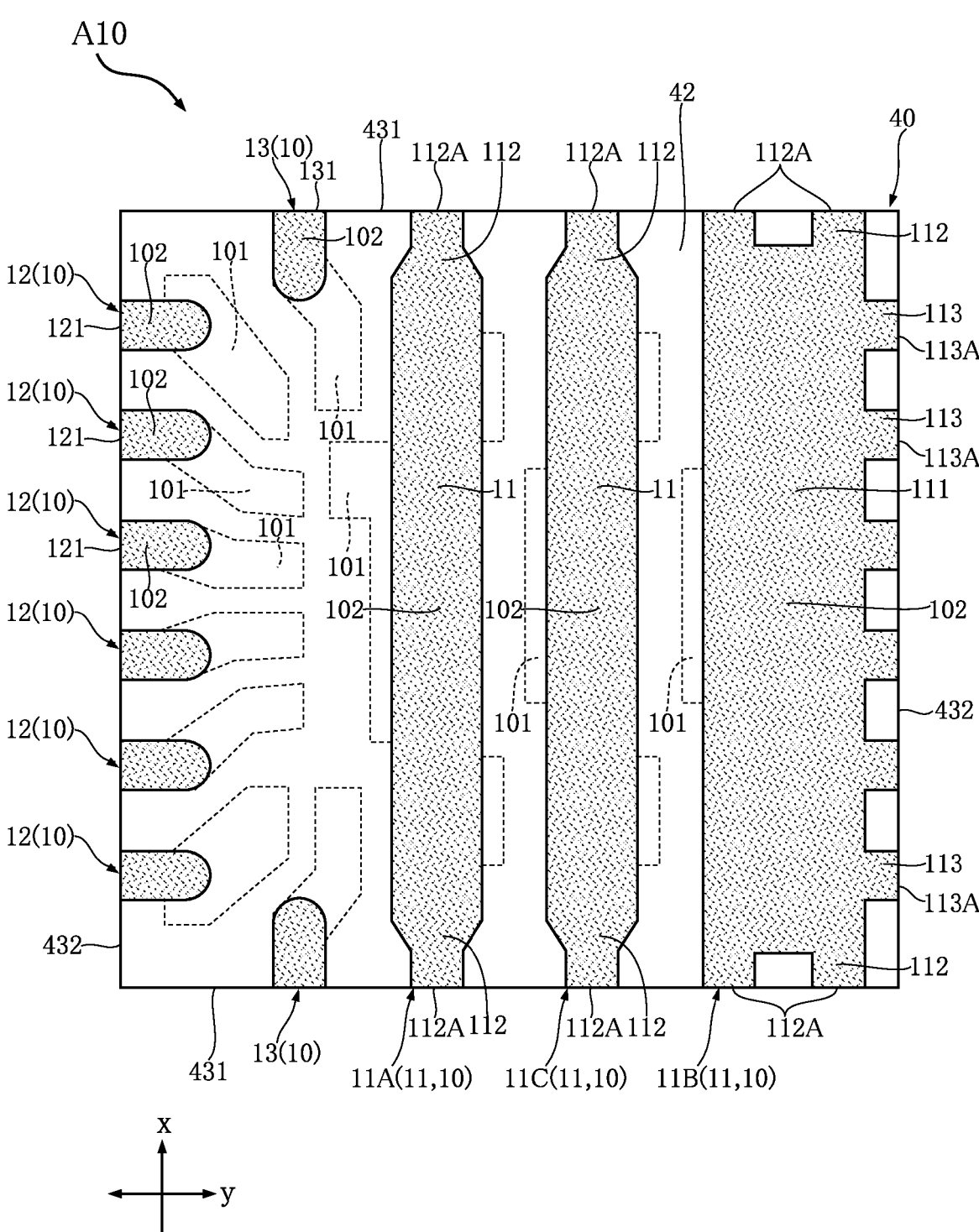
FIG. 4 is a bottom view of the semiconductor device shown in FIG. 1.

As shown in FIGS. 3 and 4, each of the first leads 11 are in the form of a strip elongated in the first direction x as viewed in the thickness direction z. The first leads 11 are disposed side by side in the second direction y. In the example of the semiconductor device A10, the plurality of first leads 11 are constituted by three terminals: a first input terminal 11A, a second input terminal 11B and an output terminal 11C. The first leads 11 are disposed in the order of the first input terminal 11A, the output terminal 11C and the second input terminal 11B from the first side toward the second side in the second direction y. The first input terminal 11A and the second input terminal 11B receive DC power (voltage) for power conversion in the semiconductor device A10. The first input terminal 11A is a positive electrode (P terminal). The second input terminal 11B is a negative electrode (N terminal). The output terminal 11C outputs AC power (voltage) converted by the switching circuit 212A in the semiconductor element 20.

As shown in FIG. 3, the first input terminal 11A is located between the second leads 12 and the output terminal 11C in the second direction y. The output terminal 11C is located between the first input terminal 11A and the second input terminal 11B in the second direction y. Each of the first input terminal 11A and the output terminal 11C includes a main section 111 and a pair of side sections 112. As shown in FIGS. 3 and 4, each of the main sections 111 is elongated in the first direction x. The first leads 11 support the semiconductor element 20 on the obverse surfaces 101 of the main sections 111. The side sections 112 are connected to opposite ends of the main section 111 in the first direction x. As shown in FIGS. 3, 4, 12 and 13, each side section 112 has a first end surface 112A. The first end surfaces 112A are connected to both the obverse surfaces 101 and the reverse surfaces 102 of the first leads 11 and face in the first direction x. The first end surfaces 112A are exposed from the sealing resin 40.

Figure 9:
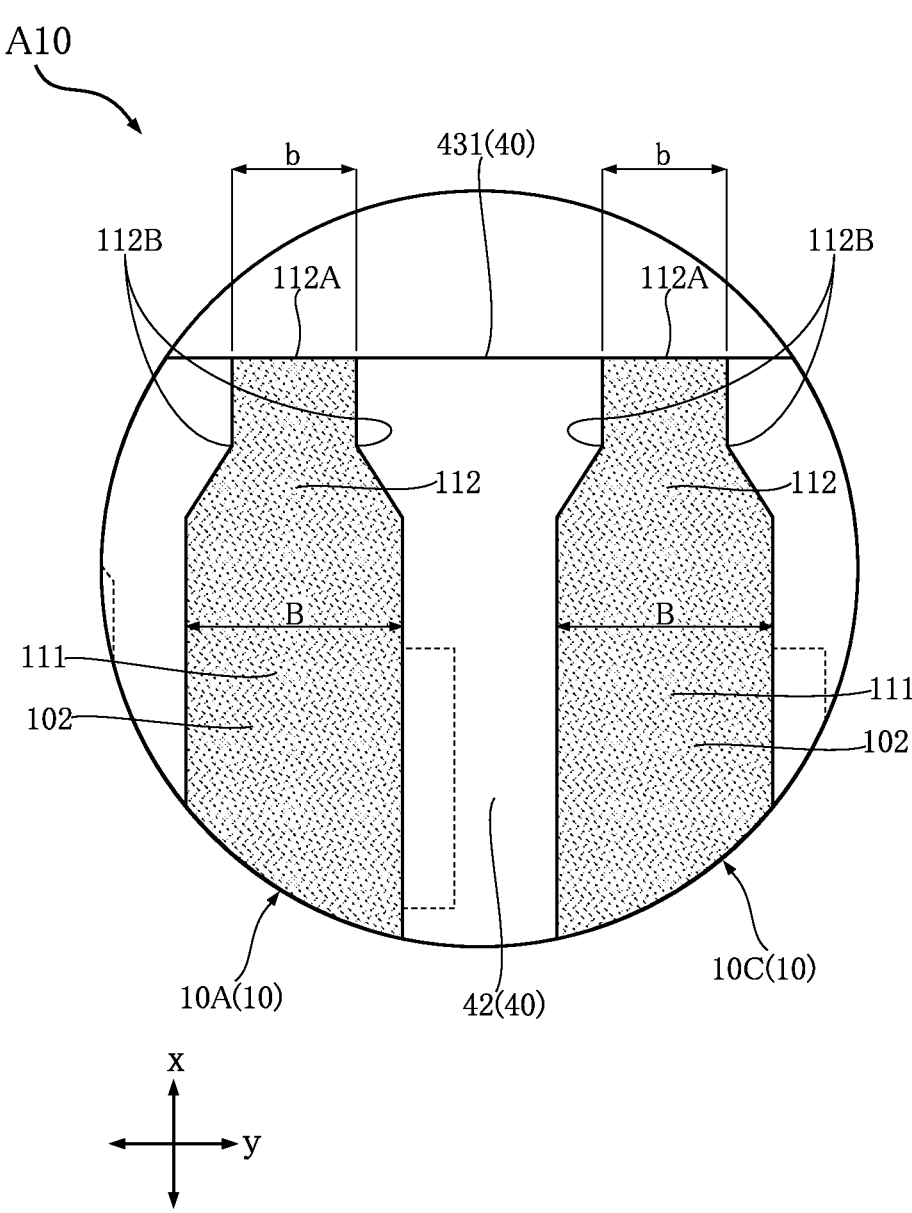
FIG. 9 is an enlarged view of a part of FIG. 3.

As shown in FIG. 9, each of the pair of side sections 112 of the first input terminal 11A and the output terminal 11C is formed with a constriction 112B. The constriction 112B extends from the obverse surface 101 to the reverse surface

102 of the first lead 11 and recessed from opposite edges in the second direction y toward the inside of the side section 112. The constriction 112B is in contact with the sealing resin 40. In the first input terminal 11A and the output terminal 11C, due to the constriction 112B, the dimension b of each first end surface 112A in the second direction y is smaller than the dimension B of the reverse surface 102 of the main section 111 in the second direction y.

Figure 7:
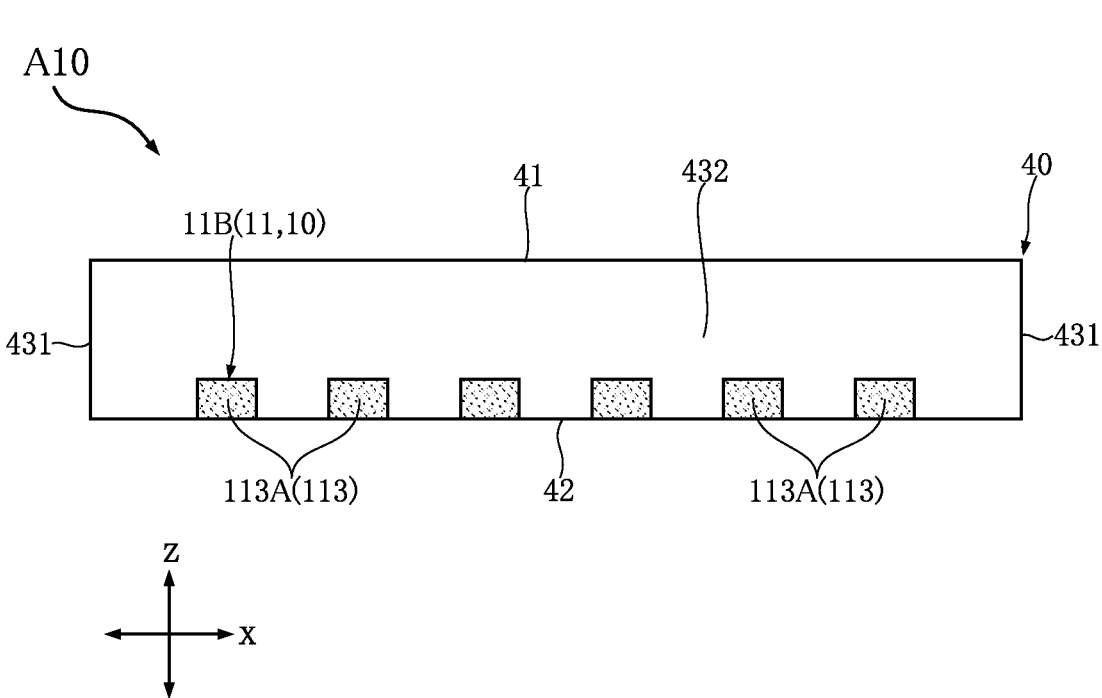
FIG. 7 is a right side view of the semiconductor device shown in FIG. 1.

As shown in FIG. 3, the second input terminal 11B is offset from the output terminal 11C toward the second side in the second direction y. That is, of the plurality of first leads 11, the second input terminal 11B is the one located on the second side in the second direction y. The second input terminal 11B includes a main section 111, a pair of side sections 112, and a plurality of projections 113. The projections 113 project from the main section 111 toward the second side in the second direction y. The space between two adjacent projections 113 is filled with the sealing resin 40. As shown in FIGS. 1-2, each of the projections 113 has a sub-end surface 113A. The sub-end surfaces 113A are connected to both the obverse surface 101 and the reverse surface 102 of the second input terminal 11B and face the second side in the second direction y. The sub-end surfaces 113A are exposed from the sealing resin 40. As shown in FIG. 7, the sub-end surfaces 113A are arranged at predetermined intervals along the first direction x.

Figure 10:
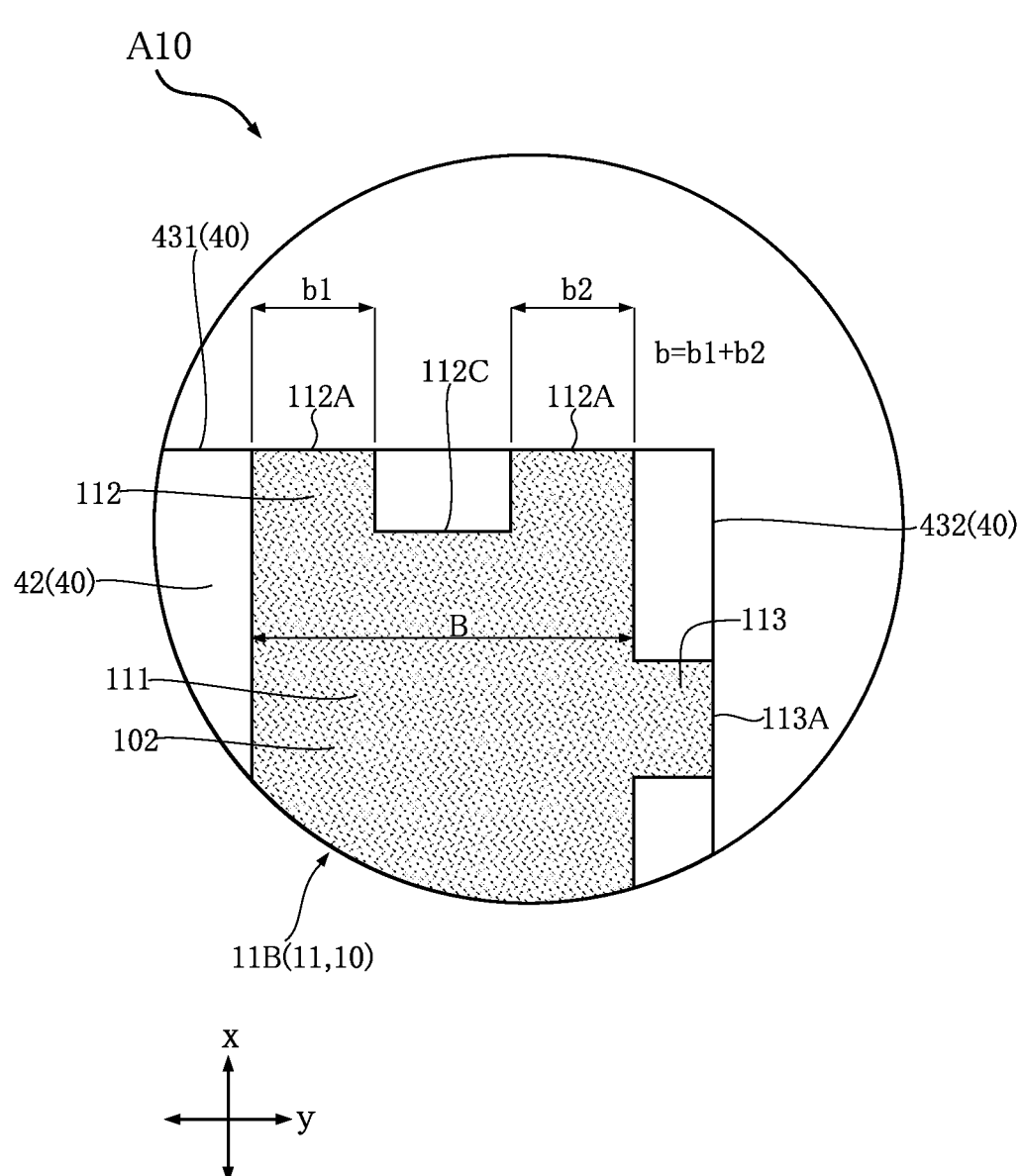
FIG. 10 is an enlarged view of a part of FIG. 3.

As shown in FIG. 10, each of the pair of side sections 112 of the second input terminal 11B is formed with an indentation 112C. The indentation 112C extends from the obverse surface 101 to the reverse surface 102 of the second input terminal 11B and is recessed from the first end surface 112A in the first direction x. Thus, the first end surface 112A is divided into two sections spaced apart from each other in the second direction y. In the second input terminal 11B, due to the indentation 112C, the dimension b of each first end surface 112A in the second direction y is smaller than the dimension B of the reverse surface 102 of the main section 111 in the second direction y. Note that the dimension b herein is the sum (b=b1+b2) of the dimension b1 of one of the sections of the first end surface 112A in the second direction y and the dimension b2 of the other section of the first end surface 112A in the second direction y. The indentation 112C is filled with the sealing resin 40.

As shown in FIGS. 3 and 4, in each of the first leads 11, the obverse surface 101 is larger in area than the reverse surface 102. In the example of the semiconductor device A10, the first input terminal 11A and the output terminal 11C are equal to each other in area of the reverse surface 102. The second input terminal 11B is larger than the first input terminal 11A and the output terminal 11C in area of the reverse surface 102.

In each of the first input terminal 11A, the second input terminal 11B and the output terminal 11C, the obverse surface 101 of the main section 111, on which the semiconductor element 20 is supported, may be plated with silver (Ag). In each of the first input terminal 11A, the second input terminal 11B and the output terminal 11C, the reverse surface 102, the pair of first end surfaces 112A and the sub-end surfaces 113A, which are exposed from the sealing resin 40, may be plated with tin (Sn). Instead of tin-plating, multiple metal-plating layers of e.g. nickel (Ni), palladium (Pd) and gold (Au) layers laminated in the stated order may be employed.

Figure 8:
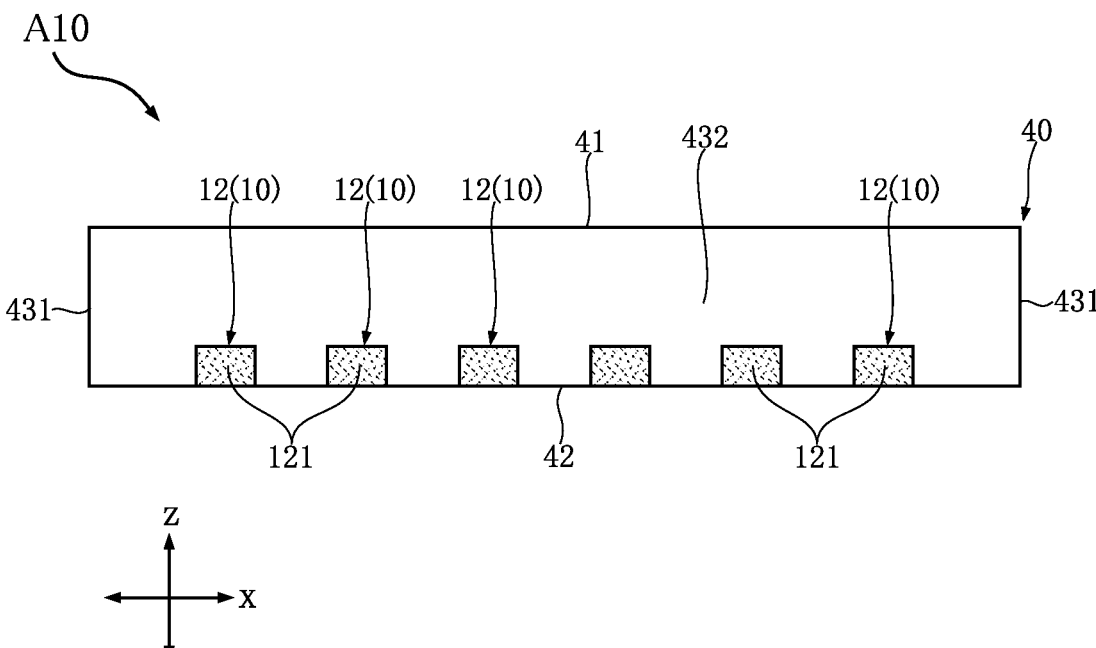
FIG. 8 is a left side view of the semiconductor device shown in FIG. 1.
Figure 11:
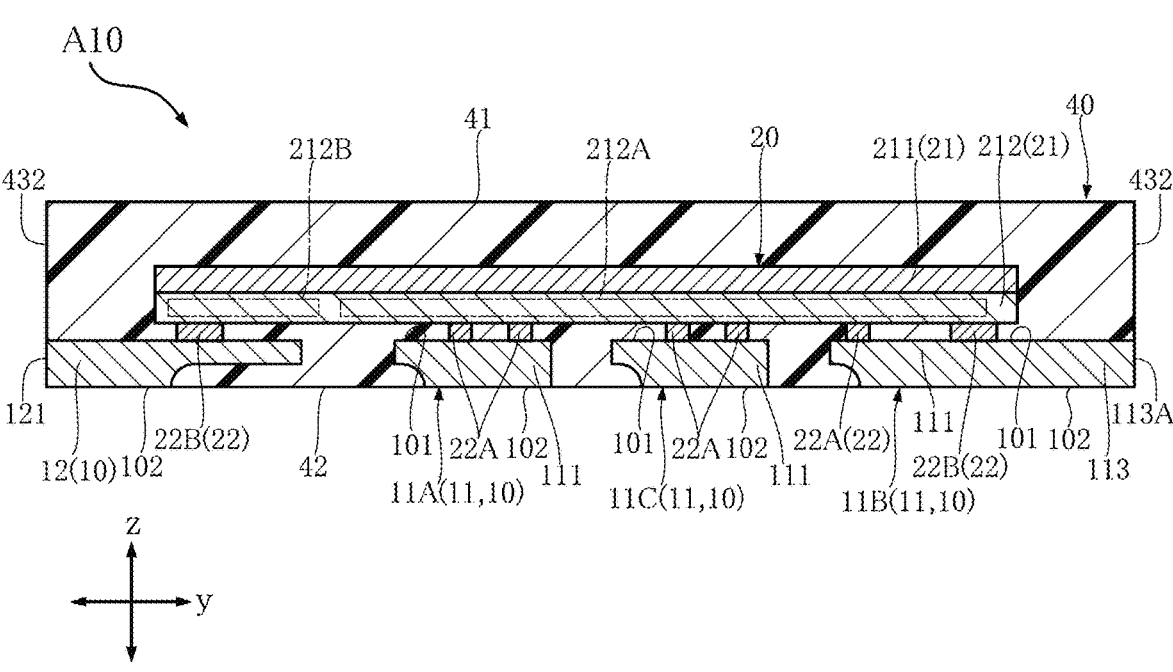
FIG. 11 is a sectional view taken along line XI-XI in FIG. 3.

As shown in FIG. 3, the plurality of second leads 12 are offset from first leads 11 toward the first side in the second direction y. One of the second leads 12 is a ground terminal of the control circuit 212B contained in the semiconductor element 20. Each of the other second leads 12 receives power (voltage) for driving the control circuit 212B or electric signals for transmission to the control circuit 212B. As shown in FIGS. 3, 4 and 11, each of the second leads 12 has a second end surface 121. The second end surfaces 121 are connected to both the obverse surfaces 101 and the reverse surfaces 102 of the second leads 12 and face the first side in the second direction y. The second end surfaces 121 are exposed from the sealing resin 40. As shown in FIG. 8, the second end surfaces 121 are arranged at predetermined intervals along the first direction x.

As shown in FIGS. 3 and 4, in each of the second leads 12, the obverse surface 101 is larger in area than the reverse surface 102. Note that the reverse surfaces 102 of the plurality of second leads 12 are equal in area. The reverse surfaces 102 of the second leads 12, on which the semiconductor element 20 is supported, may be plated with silver. The reverse surfaces 102 and the second end surfaces 121 of the second leads 12, which are exposed from the sealing resin 40, may be plated with tin. Instead of tin-plating, multiple metal-plating layers of, e.g. nickel, palladium and gold layers laminated in the stated order may be employed.

Figure 14:
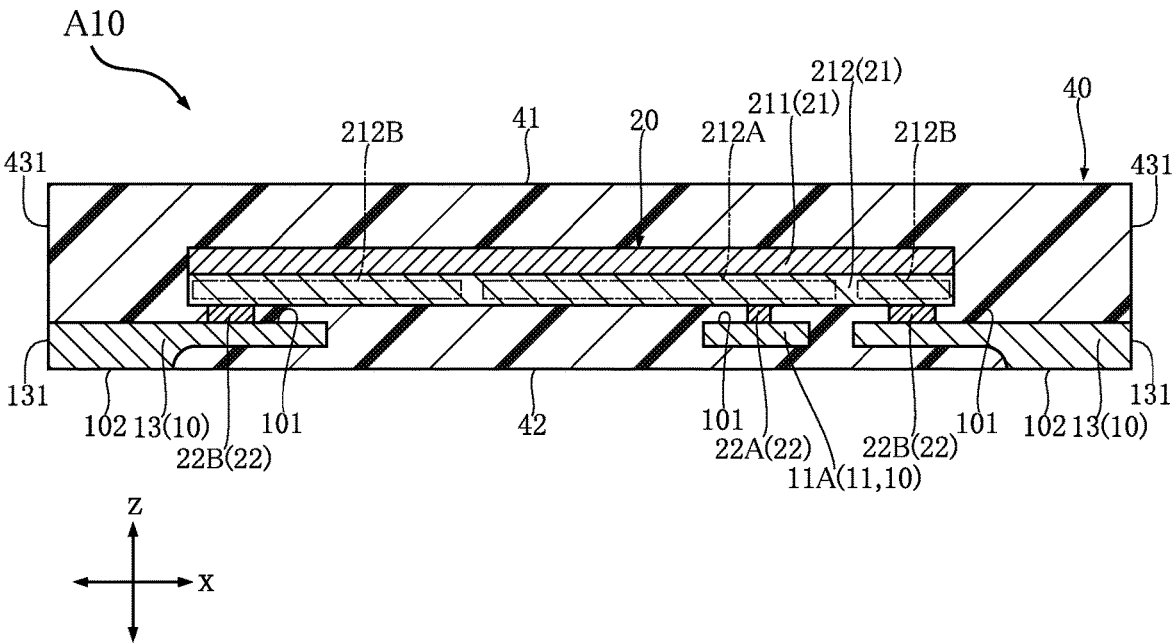
FIG. 14 is a sectional view taken along line XIV-XIV in FIG. 3.

As shown in FIG. 3, the pair of third leads 13 are located between a first lead 11 (the first input terminal 11A) and the plurality of second leads 12 in the second direction y. The third leads 13 are spaced apart from each other in the first direction x. Each of the third leads 13 receives, for example, electric signals for transmission to the control circuit 212B in the semiconductor element 20. As shown in FIGS. 3, 4 and 14, each of the third leads 13 has a third end surface 131. The third end surfaces 131 are connected to both the obverse surfaces 101 and the reverse surfaces 102 and face in the first direction x. The third end surface 131 are exposed from the sealing resin 40. Each of the third end surfaces 131 is aligned with relevant first end surfaces 112A of the first leads 11 in the second direction y.

As shown in FIGS. 3 and 4, in each of the third leads 13, the obverse surface 101 is larger in area than the reverse surface 102. The obverse surfaces 101 of the third leads 13, on which the semiconductor element 20 is supported, may be plated with silver. The reverse surfaces 102 and the third end surfaces 131 of the third leads 13, which are exposed from the sealing resin 40, may be plated with tin. Instead of tin-plating, multiple metal-plating layers of e.g. nickel, palladium and gold layers laminated in the stated order may be employed.

As shown in FIGS. 11 to 14, the semiconductor element 20 is bonded to the conductor 10 (the plurality of first leads 11, the plurality of second leads 12 and the pair of third leads 13) by flip-chip bonding and supported by these. The semiconductor element 20 is covered with the sealing resin 40. As shown in FIGS. 12 to 18, the semiconductor element 20 has a body layer 21, a plurality of electrodes 22 and a surface protective film 23.

Figure 15:
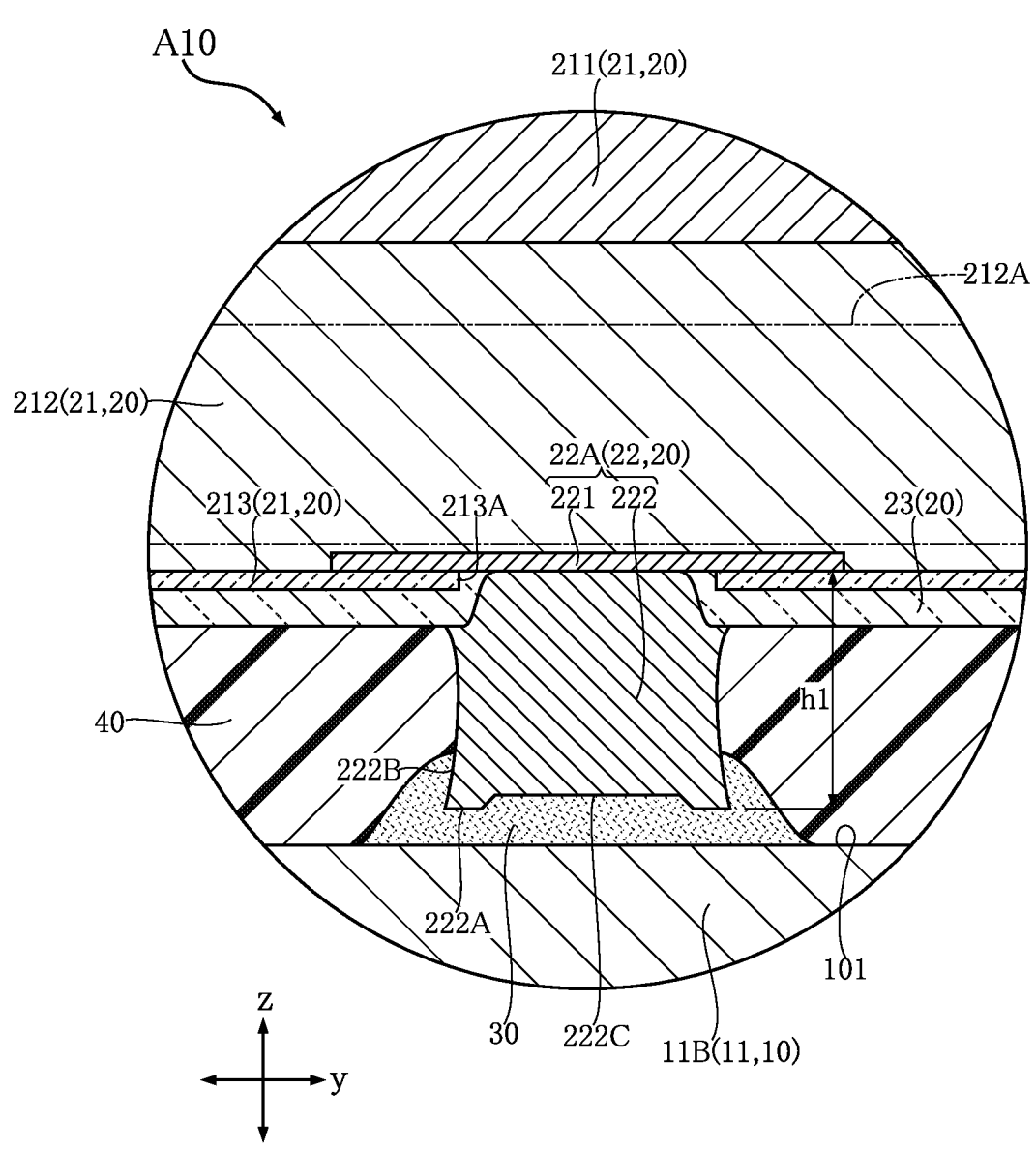
FIG. 15 is an enlarged view of a part of FIG. 11, showing a first electrode and neighboring portions.
Figure 16:
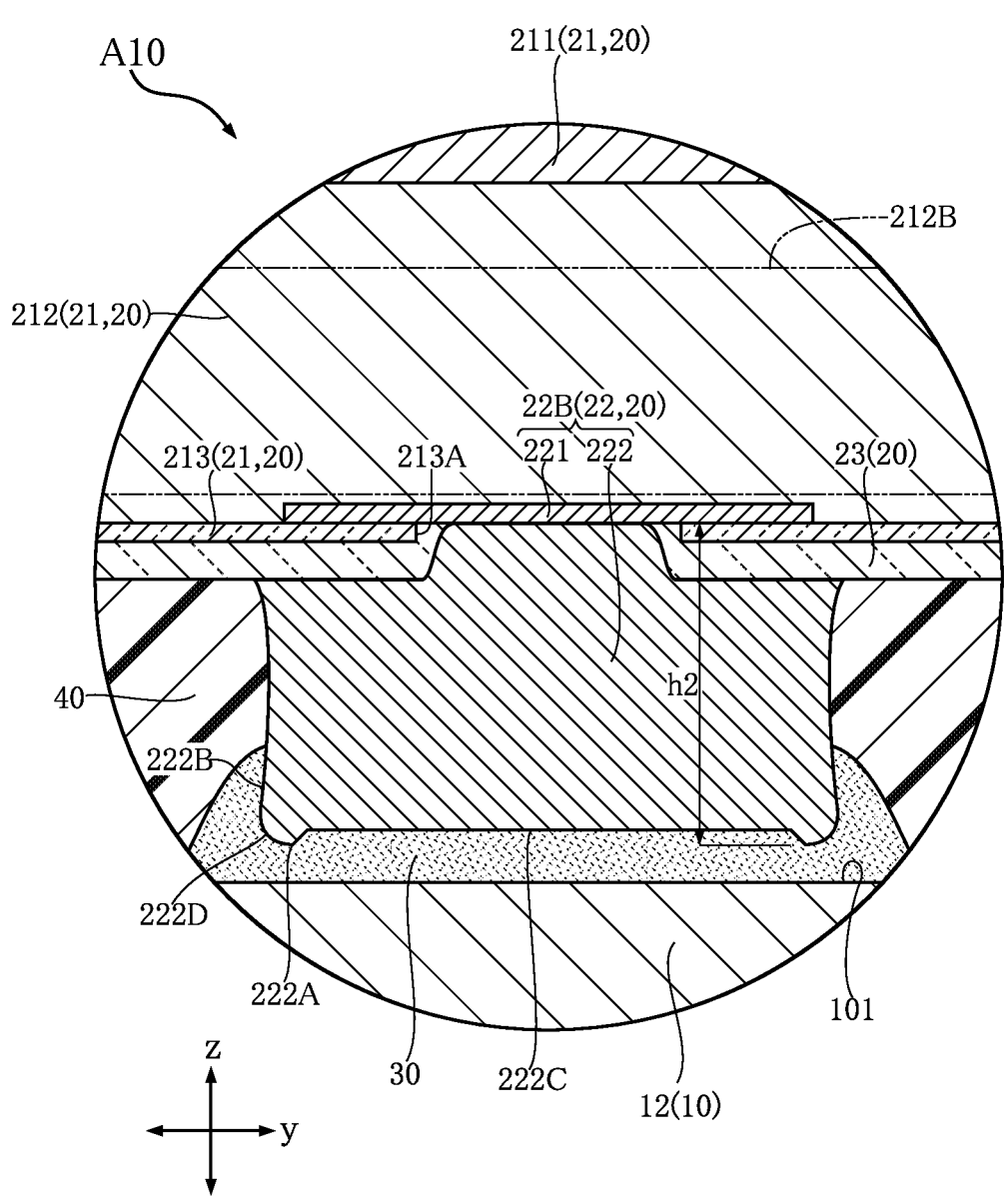
FIG. 16 is an enlarged view of a part of FIG. 11, showing a second electrode and neighboring portions.

The body layer 21 forms the main part of the semiconductor element 20. As shown in FIGS. 15 and 16, the body layer 21 has a semiconductor substrate 211, a semiconductor layer 212 and a passivation film 213. The thickness of the body layer 21 (the dimension in the thickness direction z) is not less than 100 μm and not more than 300 μm.

Figure 6:
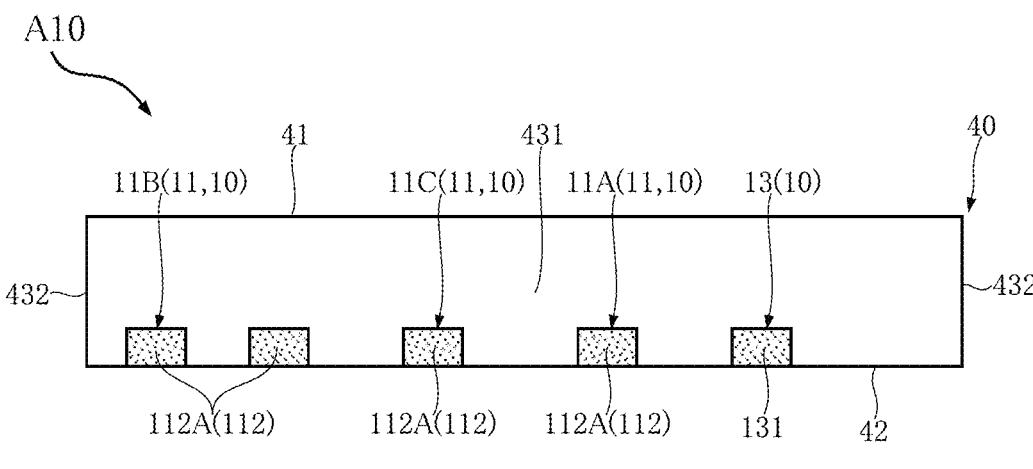
FIG. 6 is a rear view of the semiconductor device shown in FIG. 1.
Figure 6:
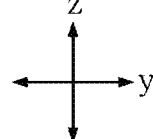

As shown in FIGS. 15 and 6, the semiconductor substrate 211 supports below it the semiconductor layer 212, the passivation film 213, the electrodes 22 and the surface protective film 23. The semiconductor substrate 211 is made of a material mainly composed of silicon (Si) or silicon carbide (SiC).

As shown in FIGS. 11 to 14, the semiconductor layer 212 is laminated on the side of the semiconductor substrate 211 that opposes the obverse surfaces 101 of the conductor 10. The semiconductor layer 212 may contain various kinds of p-type semiconductors and n-type semiconductors which differ in amount of doped elements. The semiconductor layer 212 contains a switching circuit 212A and a control circuit 212B electrically connected to the switching circuit 212A. The switching circuit 212A may be a MOSFET (Metal-Oxide-Semiconductor Field-Effect Transistor) or an IGBT (Insulated Gate Bipolar Transistor), for example. In the example of the semiconductor device A10, the switching circuit 212A is divided into two regions, i.e., a high-voltage region (upper arm circuit) and a low-voltage region (lower arm circuit). Each region is constituted by a single n-channel MOSFET. The control circuit 212B, containing e.g., a gate driver for driving the switching circuit 212A or a bootstrap circuit for the high-voltage region of the switching circuit 212A, is configured to control the switching circuit 212A. The semiconductor layer 212 is also formed with a conductor layer (not shown). The conductor layer electrically connects the switching circuit 212A and the control circuit 212B to each other.

As shown in FIGS. 15 and 16, the passivation film 213 covers the lower surface of the semiconductor layer 212. The passivation film 213 is electrically insulating. The passivation film 213 is constituted by a silicon oxide ($SiO_2$) film in contact with the lower surface of the semiconductor layer 212, and a silicon nitride ($Si_3N_4$) film laminated on the silicon oxide film. The passivation film 213 is formed with a plurality of openings 213A penetrating in the thickness direction.

As shown in FIGS. 11 to 14, the electrodes 22 project toward the obverse surfaces 101 of the conductor 10 from the side of the body layer 21 that opposes the obverse surfaces 101 of the conductor in the thickness direction z. The respective upper ends of the electrodes 22 are in contact with the semiconductor layer 212 of the body layer 21. The electrodes 22 are bonded to the obverse surfaces 101 of the conductor 10. The electrodes 22 include a plurality of first electrodes 22A and a plurality of second electrodes 22B. As shown in FIGS. 2 and 3, as viewed in the thickness direction z, each of the second electrodes 22B is located closer to the periphery of the semiconductor element 20 than any of the first electrodes 22A. At least one of the plurality of electrodes 22 is electrically connected to the switching circuit 212A of the semiconductor layer 212 and bonded to the obverse surface 101 of the relevant one of the first leads 11. At least one of the plurality of electrodes 22 is electrically connected to the control circuit 212B of the semiconductor layer 212 and bonded to the obverse surface 101 of the relevant one of the second leads 12. Also, a pair of second electrodes 22B of the plurality of second electrodes 22B are electrically connected to the control circuit 212B and individually bonded to the obverse surfaces 101 of the pair of third leads 13.

As shown in FIGS. 15 and 16, each of the electrodes 22 has a base portion 221 and a columnar portion 222. The base portion 221 is in contact with the semiconductor layer 212 of the body layer 21. Thus, each base portion 221 is electrically connected to the switching circuit 212A of the semiconductor layer 212 or the control circuit 212B of the semiconductor layer 212. Each base portion 221 contains aluminum (Al) or copper in its composition. As another configuration of the base portion 221, the base portion may be made of a plurality of metal layers laminated on the semiconductor layer 212 in the order of, from top to bottom, copper, nickel and palladium. The base portion 221 is in contact with the passivation film 213 of the body layer 21. The base portion 221 is partially exposed through the opening 213A of the passivation film 213. The columnar portion 222 projects from the part of the base portion 221 that is exposed through the opening 213A toward an obverse surface 101 of the conductor 10. The columnar portion 222 may be cylindrical, for example. The columnar portion 222 contains copper in its composition. The columnar portion 222 has an end surface 222A and a side surface 222B. The end surface 222A opposes the obverse surface 101 of the conductor 10. The side surface 222B is connected to the end surface 222A and faces in a direction orthogonal to the thickness direction z. In the semiconductor device A10, the columnar portion 222 is formed with a recess 222C recessed from the end surface 222A toward the body layer 21. The electrodes 22 are formed by electroplating.

As shown in FIG. 3, as viewed in the thickness direction z, the second electrodes 22B are larger in area of the columnar portions 222 than the first electrodes 22A. As shown in FIGS. 15 and 16, the height h2 of the columnar portion 222 of each second electrode 22B is larger than the height h1 of the columnar portion 222 of each first electrode 22A. Herein, each of the height h1 and the height h2 of the electrodes 22 refers to the distance in the thickness direction z from the end surface 222A to the boundary between the columnar portion 222 and the base portion 221. The height h2 of the columnar portion 222 of each second electrode 22B is not less than 110% and not more than 120% of the height h1 of the columnar portion 222 of each first electrode 22A.

As shown in FIG. 16, the columnar portion 222 of each second electrode 22B has a curved surface 222D that forms the boundary between the end surface 222A and the side surface 222B. The curved surface 222D bulges toward the outside of the columnar portion 222.

As shown in FIGS. 15 and 16, the surface protective film 23 covers the side of the body layer 21 that opposes the obverse surface 101 of the conductor 10, i.e., the passivation film 213 of the body layer 21. In each of the electrodes 22, the end surface 222A of the columnar portion 222 is located between an obverse surface 101 of the conductor 10 and the surface protective film 23 in the thickness direction z. In the semiconductor device A10, the surface protective film 23 is in contact with both the base portions 221 and the columnar portions 222 of the plurality of electrodes 22. The surface protective film 23 is electrically insulating. The surface protective film 23 may be made of a material containing polyimide, for example.

As shown in FIGS. 15 and 16, the bonding layer 30 is in contact with both the obverse surfaces 101 of the conductor 10 and the plurality of electrodes 22. The bonding layer 30 is electrically conductive. Thus, the electrodes 22 are bonded to the obverse surfaces 101 of the conductor 10, being electrically connected to the conductor 10. The bonding layer 30 may be, for example, a lead-free solder containing tin and silver in its composition. In each of the electrodes 22, the bonding layer 30 is in contact with both the end surface 222A and the side surface 222B of the columnar portion 222. In the semiconductor device A10, the bonding layer 30 is in contact with the recess 222C of the columnar portion 222 as well.

As shown in FIGS. 5 to 8, the sealing resin 40 has a top surface 41, a bottom surface 42, a pair of first side surfaces 431 and a pair of second side surfaces 432. The sealing resin 40 may be made of a material containing black epoxy resin, for example.

As shown in FIGS. 11 to 14, the top surface 41 faces the side which the obverse surface 101 of the conductor 10 faces in the thickness direction z. As shown in FIGS. 5 to 8, the bottom surface 42 faces away from the top surface 41. As shown in FIG. 4, the reverse surfaces 102 of the first leads 11, the reverse surfaces 102 of the second leads 12 and the reverse surfaces 102 of the third leads 13 are exposed from the bottom surface 42.

Figure 12:
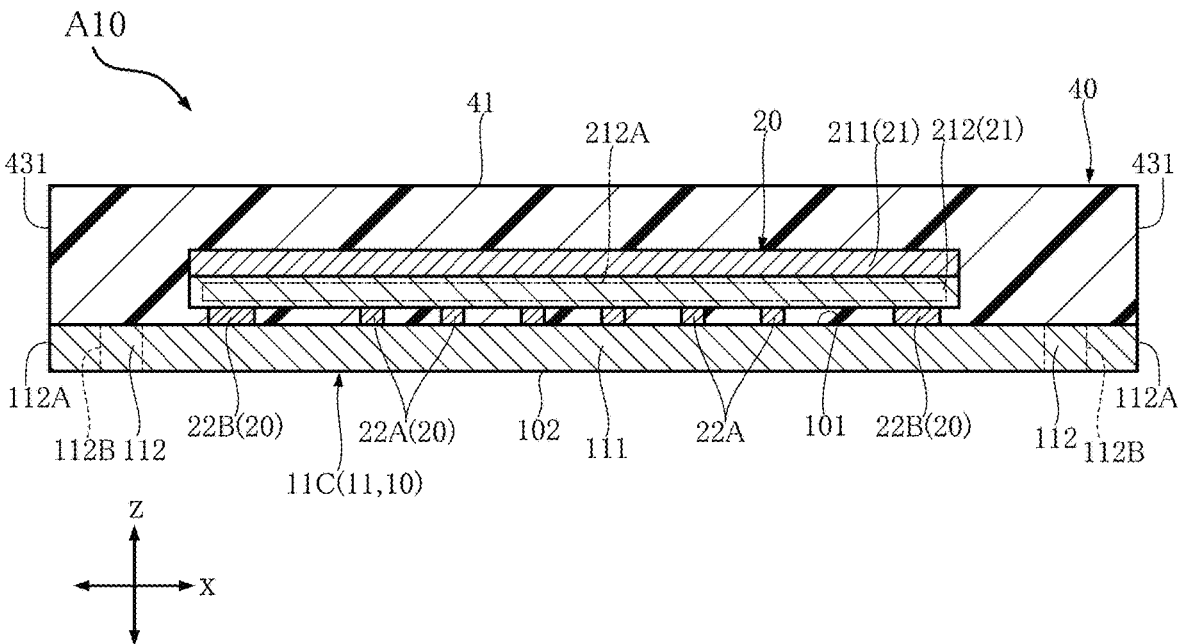
FIG. 12 is a sectional view taken along line XII-XII in FIG. 3.
Figure 13:
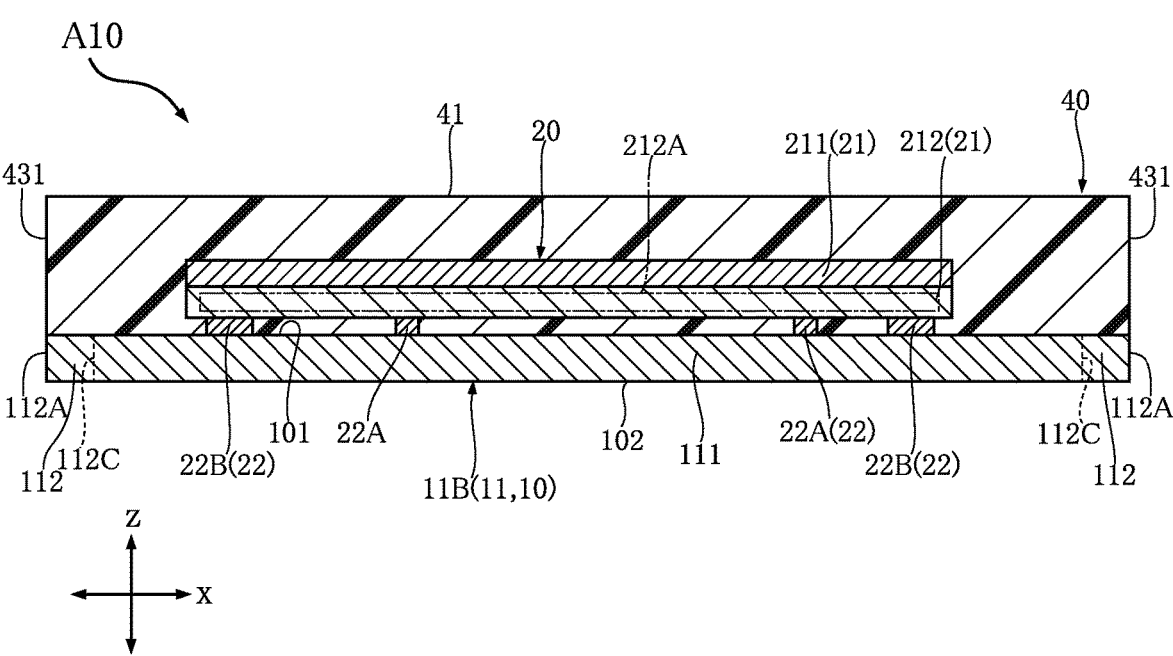
FIG. 13 is a sectional view taken along line XIII-XIII in FIG. 3.

As shown in FIGS. 7 and 8, the pair of first side surfaces 431 are connected to both the top surface 41 and the bottom surface 42 and face in the first direction x. The first side surfaces 431 are spaced apart from each other in the second direction y. As shown in FIGS. 12 to 14, the first end surfaces 112A of the first leads 11 and the third end surfaces 131 of the third leads 13 are exposed from the first side surfaces 431 to be flush with the first side surfaces 431.

Figure 5:
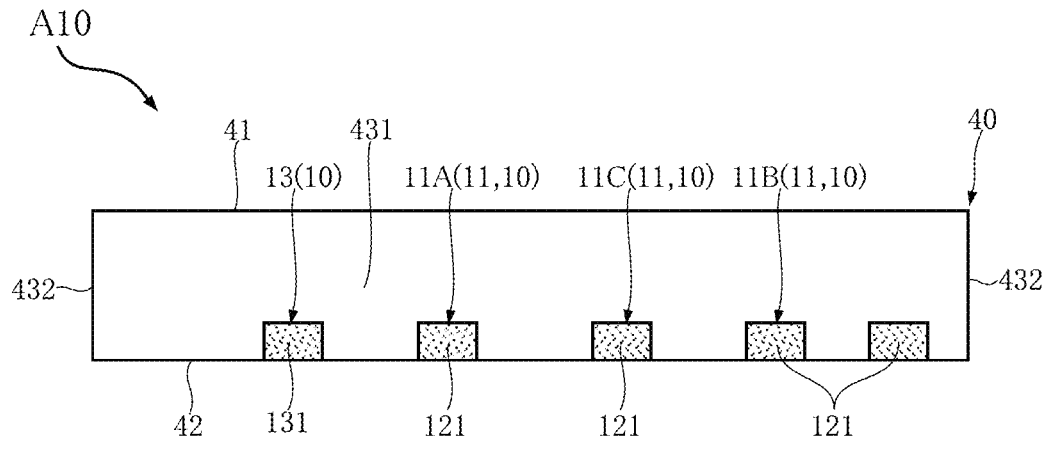
FIG. 5 is a front view of the semiconductor device shown in FIG. 1.
Figure 5:
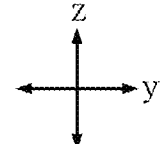

As shown in FIGS. 5 and 6, the pair of second side surfaces 432 are connected to the top surface 41, the bottom surface 42 and the first side surfaces 431 and face in the second direction y. The second side surfaces 432 are spaced apart from each other in the first direction x. As shown in FIG. 11, the second end surfaces 121 of the second leads 12 are exposed from one of the second side surfaces 432 that is located on the first side in the second direction y to be flush with the second side surface 432. The sub-end surfaces 113A of the second input terminal 11B (one of the first leads 11) are exposed from the other one of the second side surfaces 432 that is located on the second side in the second direction y to be flush with the second side surface 432.

The advantages of the semiconductor device A10 are described below.

The semiconductor device A10 includes the conductor 10 having obverse surfaces 101, the semiconductor element 20 having a plurality of electrodes 22, and the bonding layer 30 bonding the obverse surfaces 101 and the electrodes 22. Each of the electrodes 22 has a base portion 221 in contact with the side of the body layer 21 that opposes the obverse surface 101, and a columnar portion 222 projecting from the base portion 221 toward the obverse surface 101 and in contact with the bonding layer 30. Thus, the semiconductor element 20 is bonded to the conductor 10 by flip-chip bonding.

The plurality of electrodes 22 include first electrodes 22A, and second electrodes 22B located closer to the periphery of the body layer 21 of the semiconductor element 20 than are the first electrodes 22A as viewed in the thickness direction z. As viewed in the thickness direction z, the second electrodes 22B are larger in area of the columnar portions 222 than the first electrodes 22A. Such a configuration provides a relatively large contact area between the columnar portion 222 of each second electrode 22B and the bonding layer 30, thereby increasing the bonding strength between the columnar portion 222 and the bonding layer 30. This provides the following advantage. In flip-chip bonding the semiconductor element 20 to the conductor 10, the body layer 21 is subjected to thermal stress due to the ref lowing and thereby tends to warp upward in the thickness direction. However, the second electrodes 22B can exert a relatively large resistive force against such warping. Accordingly, in manufacturing the semiconductor device A10, it is possible to reduce the warping in the thickness direction z of the semiconductor element 20 when it is flip-chip bonded.

The height h2 of the columnar portions 222 of the second electrodes 22B is larger than the height h1 of the columnar portions 222 of the first electrodes 22A. Thus, even when the body layer 21 warps in the thickness direction z in flip-chip bonding the semiconductor element 20 to the conductor 10, a certain proportion of the columnar portion 222 of the second electrode 22B is embedded in the bonding layer 30. Such an embedded state is provided by the semiconductor element 20 sinking into the bonding layer 30 toward the conductor 10 by its own weight as a result of melting of the bonding layer 30 by ref lowing. To achieve the above effect, it is preferable that the height h2 of the columnar portions 222 of the second electrodes 22B is not less than 110% and not more than 120% of the height h1 of the columnar portions 222 of the first electrodes 22A. Thus, even when the semiconductor element 20 warps in the thickness direction z during the manufacture of the semiconductor device A10, deterioration of the conduction between the second electrodes 22B and the conductor 10 is prevented.

The columnar portion 222 of each second electrode 22B has a curved surface 222D that forms the boundary between the end surface 222A and the side surface 222B. The curved surface 222D bulges toward the outside of the columnar portion 222. In flip-chip bonding the semiconductor element 20 to the conductor 10, when the body layer 21 tries to warp in the thickness direction z, a stress is exerted on the interface between the bonding layer 30 and the second electrodes 22B. The present configuration prevents such a stress from concentrating on the columnar portions 222 of the second electrodes 22B.

In the semiconductor device A10, the columnar portion 222 of each electrode 22 is formed with a recess 222C recessed from the end surface 222A toward the body layer 21. The recess 222C is in contact with the bonding layer 30. The columnar portion 222 having such a configuration provides an anchoring effect on the bonding layer 30. This leads to an increased bonding strength between the columnar portion 222 and the bonding layer 30.

The semiconductor layer 212 of the body layer 21 of the semiconductor element 20 contains a switching circuit 212A. At least one of the electrodes 22 is electrically connected to the switching circuit 212A. The reverse surface 102 of each of the first leads 11, which are included in the conductor 10 and to which at least one of the electrodes 22 is bonded, is exposed from the bottom surface 42 of the sealing resin 40. With such a configuration, the heat generated from the semiconductor element 20 due to the driving of the switching circuit 212A efficiently dissipates to the outside.

As mentioned above, each of the electrodes 22 has a base portion 221 and a columnar portion 222. The material of the columnar portion 222 contains copper. The columnar portion 222 has a shorter length and a larger cross sectional area than a bonding wire. Thus, the parasitic resistance between the first leads 11 and the switching circuit 212A can be reduced as compared with the case where the first leads 11 and the base portions 221 are connected with bonding wires. Reduced parasitic resistance reduces on-resistance and noise in the switching circuit 212A.

Each of the first leads 11 has a main section 111 elongated in the first direction x and a pair of side sections 112 connected to opposite ends of the main section 111 in the first direction x. Each of the pair of side sections 112 has a first end surface 112A facing in the first direction x and exposed from a first side surface 431 of the sealing resin 40. Each first end surface 112A is flush with the first side surface 431. In the second direction y, the dimension b of each first end surface 112A is smaller than the dimension B of the reverse surface 102 of the main section 111. With such a configuration, the area of each first end surface 112A can be made smaller than that in a conventional QFN-type semiconductor device. This makes it possible to reduce the generation of metal burrs on the first end surfaces 112A due to blade dicing for division into individual pieces during the manufacture of the semiconductor device A10. Reduced metal burrs allows easy and reliable mounting of the semiconductor device A10 to a wiring board.

As shown in FIG. 9, each of the pairs of side sections 112 of the first leads 11 (the first input terminal 11A and the output terminal 11C) is formed with a constriction 112B. Thus, the dimension b of each first end surface 112A can be made smaller than the dimension B of the reverse surface 102 of the main section 111. The constriction 112B is in contact with the sealing resin 40 in the first direction x. This prevents the first leads 11 from falling off through the first side surfaces 431 of the sealing resin 40.

As shown in FIG. 10, each of the pair of side sections 112 of a first lead 11 (the second input terminal 11B) is formed with an indentation 112C. With such a configuration again, the dimension b of each first end surface 112A can be made smaller than the dimension B of the reverse surface 102 of the main section 111 of the first lead 11. The indentation 112C is filled with the sealing resin 40. Thus, the first lead 11 is in contact with the sealing resin 40 in the first direction x. This prevents the first lead 11 from falling off through the first side surfaces 431 of the sealing resin 40.

The second input terminal 11B includes a plurality of projections 113 projecting from the second side of the main section 111 in the second direction y. Each of the projections 113 has a sub-end surface 113A facing in the second direction y. The sub-end surfaces 113A are exposed from one of the second side surfaces 432 of the sealing resin 40 that is located on the second side in the second direction y. Thus, the second input terminal 11B is in contact with the sealing resin 40 on the second side in the second direction y. Thus, the second input terminal 11B is prevented from falling off through the second side surface 432 on the second side in the second direction y.

In each of the first leads 11, the obverse surface 101 is made larger in area than the reverse surface 102. Thus, each first lead 11 is in contact with the sealing resin 40 on the reverse surface 102 side in the thickness direction z. With such a configuration, the first leads 11 are prevented from falling off through the bottom surface 42 of the sealing resin 40. Moreover, the obverse surface 101 of each first lead 11, on which at least one of the electrodes 22 is bonded, can have a relatively large area. This allows mounting a larger number of electrodes 22 on the first leads 11.

The conductor 10 further includes a plurality of second leads 12 on each of which at least one electrode 22 is bonded. In each of the second leads 12, the obverse surface 101 is made larger in area than the reverse surface 102. With such a configuration, as with the relationship between the obverse surface 101 and the reverse surface 102 of the first leads 11, the second leads 12 are prevented from falling off through the bottom surface 42 of the sealing resin 40. Moreover, each second lead 12, on which at least one of the electrodes 22 is bonded, can have a relatively large area. This allows mounting a larger number of electrodes 22 on the second leads 12.

Second Embodiment

A semiconductor device A20 according to a second embodiment of the present disclosure is described below with reference to FIGS. 17 and 18. In these figures, the elements that are identical or similar to those of the semiconductor device A10 described above are denoted by the same reference signs, and the descriptions thereof are omitted. Note that FIG. 17 is a sectional view taken along the same plane as FIG. 15, and FIG. 18 is a sectional view taken along the same plane as FIG. 16.

The semiconductor device A20 differs from the semiconductor device A10 in configuration of the electrodes 22 of the semiconductor element 20.

Figure 17:
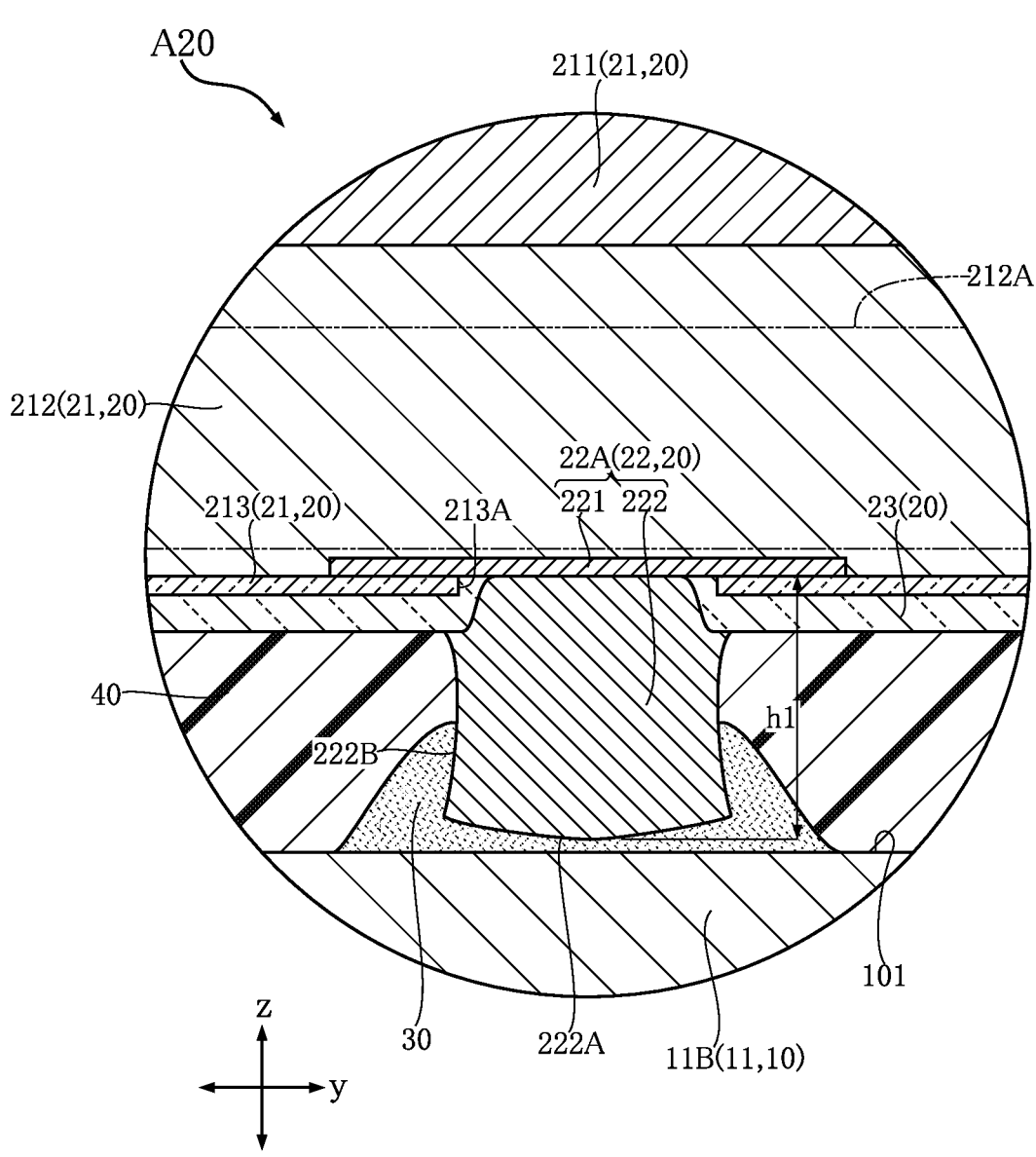
FIG. 17 is an enlarged view of a semiconductor device according to a second embodiment of the present disclosure, showing a first electrode and neighboring portions.
Figure 18:
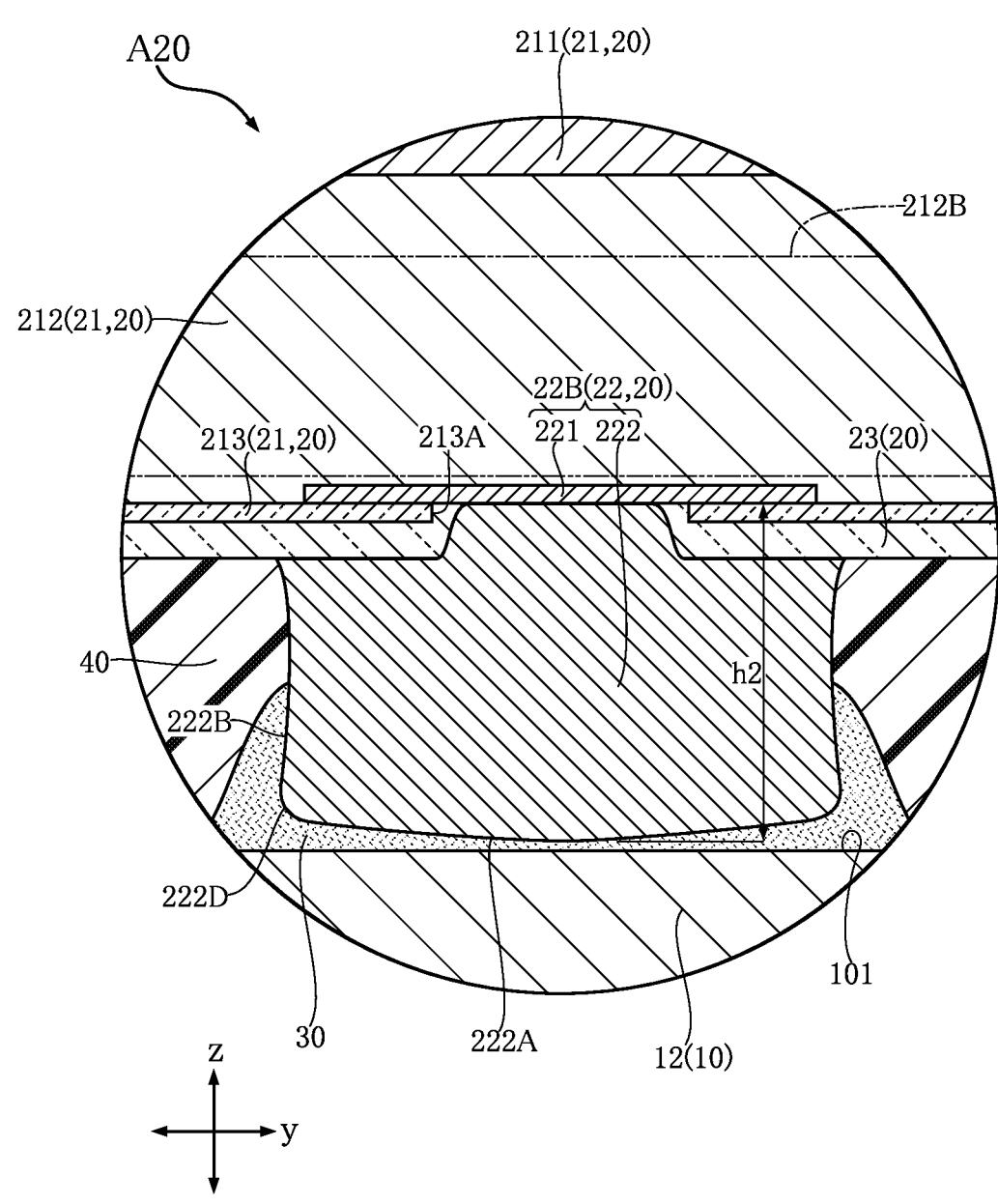
FIG. 18 is an enlarged view of the semiconductor device shown in FIG. 17, showing a second electrode and neighboring portions.

As shown in FIGS. 17 and 18, in each of the electrodes 22 (the first electrodes 22A and the second electrodes 22B), the end surface 222A of the columnar portion 222 bulges toward an obverse surface 101 of the conductor 10.

The advantages of the semiconductor device A20 are described below.

The semiconductor device A20 includes the conductor 10 having obverse surfaces 101, the semiconductor element 20 having a plurality of electrodes 22, and the bonding layer 30 bonding the obverse surfaces 101 and the electrodes 22. Each of the electrodes 22 has a base portion 221 in contact with the side of the body layer 21 that opposes the obverse surface 101, and a columnar portion 222 projecting from the base portion 221 toward the obverse surface 101 and in contact with the bonding layer 30. The plurality of electrodes 22 include first electrodes 22A, and second electrodes 22B located closer to the periphery of the body layer 21 of the semiconductor element 20 than are the first electrodes 22A as viewed in the thickness direction z. As viewed in the thickness direction z, the second electrodes 22B are larger in area of the columnar portions 222 than the first electrodes 22A. Thus, the semiconductor device A20 can also reduce the warp in the thickness direction z of the semiconductor element 20 that is flip-chip bonded during the manufacture of the device.

In the semiconductor device A20, in each of the electrodes 22, the end surface 222A of the columnar portion 222 bulges toward an obverse surface 101 of the conductor 10. With such a configuration, in bonding the semiconductor element 20 to the conductor 10 by flip-chip bonding, the bonding layer 30 between the obverse surface 101 and the columnar portion 222 is pushed and spreads in a direction orthogonal to the thickness direction z. The spread bonding layer 30 comes into contact with the side surface 222B of the columnar portion 222. This increases the contact area between the bonding layer 30 and the side surface 222B, which leads to an increased bonding strength of the columnar portion 222 to the bonding layer 30.

Third Embodiment

A semiconductor device A30 according to a third embodiment of the present disclosure is described below with reference to FIG. 19. In these figures, the elements that are identical or similar to those of the semiconductor device A10 described above are denoted by the same reference signs, and the descriptions thereof are omitted. Note that FIG. 19 is a sectional view taken along the same plane as FIG. 16.

The semiconductor device A30 differs from the semiconductor device A10 in configuration of the electrodes 22 and the surface protective film 23 of the semiconductor element 20.

Figure 19:
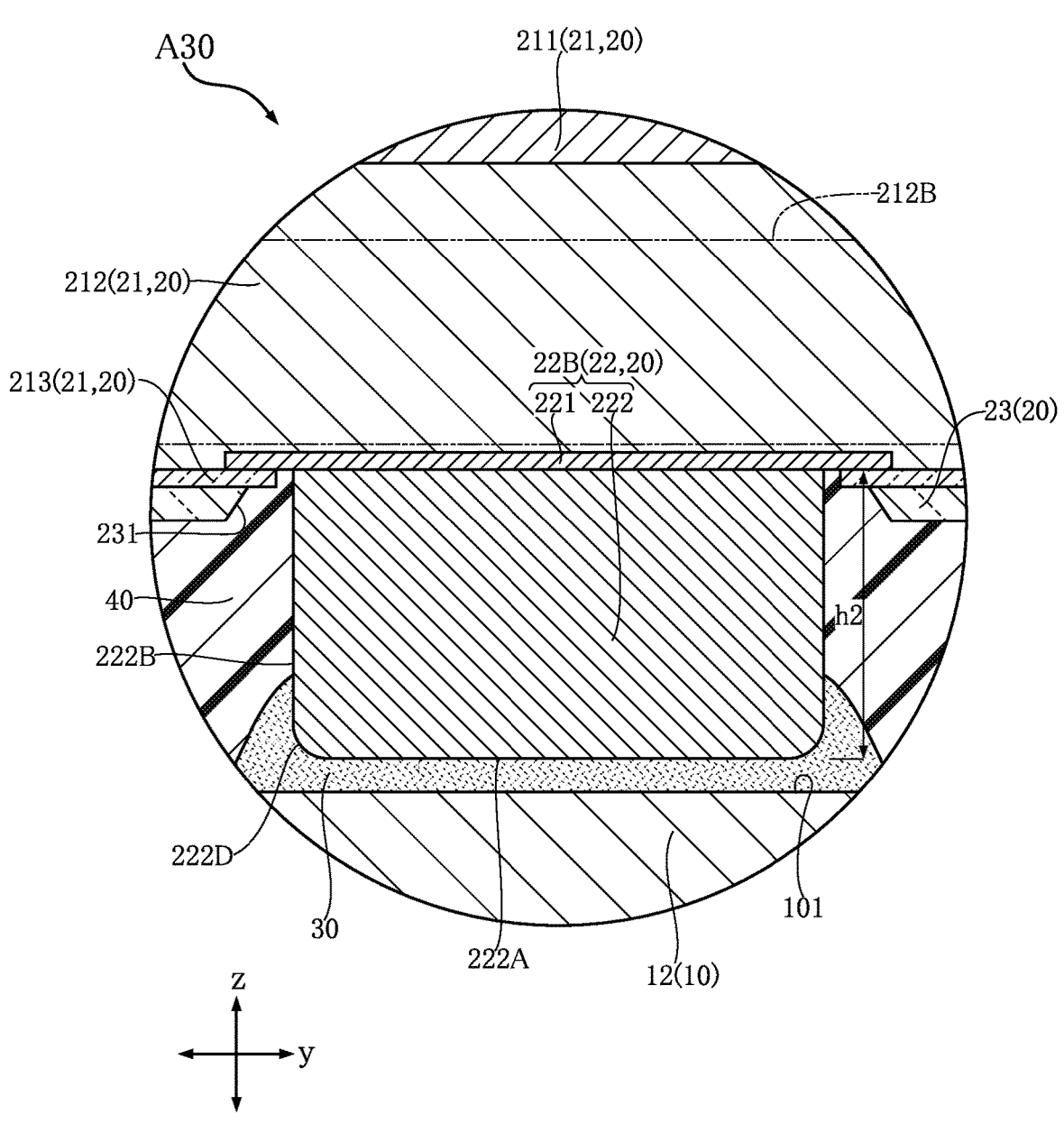
FIG. 19 is an enlarged view of a semiconductor device according to a third embodiment of the present disclosure, showing a second electrode and neighboring portions.

As shown in FIG. 19, in each of the second electrodes 22B among the electrodes 22, the end surface 222A of the columnar portion 222 is in parallel with an obverse surface 101 of the conductor 10.

As shown in FIG. 19, the surface protective film 23 is separated from the columnar portion 222 of each second electrodes 22B. The surface protective film 23 is formed with a plurality of openings 231 penetrating in the thickness direction z. Each of the openings 231 exposes the columnar portion 222 of one of the second electrodes 22B. With such a configuration, in forming the second electrodes 22B, the volume of the columnar portion 222 of each second electrode 22B can be made larger than the volume of the columnar portion 222 of each second electrode 22B in each of the semiconductor device A10 and the semiconductor device A20.

The advantages of the semiconductor device A30 are described below.

The semiconductor device A30 includes the conductor 10 having obverse surfaces 101, the semiconductor element 20 having a plurality of electrodes 22, and the bonding layer 30 bonding the obverse surfaces 101 and the electrodes 22. Each of the electrodes 22 has a base portion 221 in contact with the side of the body layer 21 that opposes the obverse surface 101, and a columnar portion 222 projecting from the base portion 221 toward the obverse surface 101 and in contact with the bonding layer 30. The plurality of electrodes 22 include first electrodes 22A, and second electrodes 22B located closer to the periphery of the body layer 21 of the semiconductor element 20 than are the first electrodes 22A as viewed in the thickness direction z. As viewed in the thickness direction z, the second electrodes 22B are larger in area of the columnar portions 222 than the first electrodes 22A. Thus, the semiconductor device A30 can also reduce the warp in the thickness direction z of the semiconductor element 20 that is flip-chip bonded during the manufacture of the device.

In the semiconductor device A30, the surface protective film 23 of the semiconductor element 20 is separated from the columnar portions 222 of the second electrodes 22B. With such a configuration, in forming the second electrodes 22B, the volume of the columnar portion 222 of each second electrode 22B can be made larger than the volume of the columnar portion 222 of each second electrode 22B in each of the semiconductor device A10 and the semiconductor device A20. Thus, the area of the columnar portion 222 of each second electrode 22B can be reliably made larger than the area of the columnar portion 222 of each first electrode 22A, as viewed in the thickness direction z.

In the semiconductor devices A10 to A30, the conductor 10 includes a plurality of leads (the plurality of first leads 11, the plurality of second leads 12, and the pair of third leads 13) made of a same lead frame. As another example, the conductor 10 may be a conductor layer formed on an insulating layer and including a plurality of separate regions.

The present disclosure is not limited to the foregoing embodiments. The specific configuration of each part of the present disclosure may be varied in design in many ways.

LIST OF REFERENCE CHARACTERS

A10, A20, A30: Semiconductor device
10: Conductor
101: Obverse surface
102: Reverse surface
11: First lead
11A: First input terminal
11B: Second input terminal
11C: Output terminal
111: Main section
112: Side section
112A: First end surface
112B: Constriction
112C: Indentation
113: Projection
113A: Sub-end surface 12: Second lead
121: Second end surface
13: Third lead
131: Third end surface
20: Semiconductor element
21: Body layer
211: Semiconductor substrate
212: Semiconductor layer
212A: Switching circuit
212B: Control circuit
213: Passivation film
213A: Opening
22: Electrode
22A: First electrode
22B: Second electrode
221: Base portion
222: Columnar portion
222A: End surface
222B: Side surface
222C: Recess
222D: Curved surface
23: Surface protective film
231: Opening
30: Bonding layer
40: Sealing resin
41: Top surface
42: Bottom surface
431: First side surface
432: Second side surface
B: Dimension
b, b1, b2: Dimension
h1, h2: Height
z: Thickness direction
x: First direction
y: Second direction

The invention claimed is:

1. A semiconductor device comprising:
a conductor having obverse surfaces and reverse surfaces facing away from each other in a thickness direction;
a semiconductor element having a body layer and a plurality of electrodes, the plurality of electrodes projecting toward the obverse surfaces from a side of the body layer that opposes the obverse surfaces in the thickness direction; and
a bonding layer bonding the obverse surfaces and the plurality of electrodes,
wherein each of the plurality of electrodes has a base portion in contact with the body layer and a columnar portion projecting from the base portion and in contact with the bonding layer,
the plurality of electrodes include a first electrode and a second electrode, the second electrode being located closer to a periphery of the body layer than is the first electrode as viewed in the thickness direction,
the columnar portion of the second electrode has a larger area than the columnar portion of the first electrode as viewed in the thickness direction,
the columnar portion of each of the plurality of electrodes has an end surface opposing a relevant one of the obverse surfaces, and a side surface connected to the end surface and facing in a direction orthogonal to the thickness direction,
the columnar portion of each of the plurality of electrodes is formed with a recess that is recessed from the end surface toward the body layer, as viewed in the thickness direction, an entirety of the recess is spaced apart from the side surface, and a center of the columnar portion overlaps with the recess,
the bonding layer is in contact with the end surface and the side surface, and
the columnar portion of the second electrode has a curved surface forming a boundary between the end surface and the side surface and bulging toward an outside of the columnar portion.

2. The semiconductor device according to claim 1, wherein a height of the columnar portion of the second electrode is larger than a height of the columnar portion of the first electrode.

3. The semiconductor device according to claim 2, wherein the height of the columnar portion of the second electrode is not less than 110% and not more than 120% of the height of the columnar portion of the first electrode.

4. The semiconductor device according to claim 1, wherein the semiconductor element has a surface protective film covering the side of the body layer that opposes the obverse surfaces in the thickness direction, and
the end surface of each of the plurality of electrodes is located between the obverse surface and the surface protective film in the thickness direction.

5. The semiconductor device according to claim 4, wherein the base portion and the columnar portion of each of the plurality of electrodes are in contact with the surface protective film.

6. The semiconductor device according to claim 1, wherein
the bonding layer is in contact with the recess.

7. The semiconductor device according to claim 1, wherein the conductor includes a plurality of first leads and a plurality of second leads,
the plurality of first leads are elongated in a first direction orthogonal to the thickness direction and disposed side by side in a second direction orthogonal to the thickness direction and the first direction,
the plurality of second leads are located away from the plurality of first leads in the second direction,
the body layer includes a semiconductor substrate and a semiconductor layer laminated on a side of the semiconductor substrate that opposes the obverse surfaces in the thickness direction,
the semiconductor layer contains a switching circuit and a control circuit for the switching circuit,
at least one of the plurality of electrodes is electrically connected to the switching circuit and bonded to the obverse surface of one of the plurality of first leads, and
at least one of the plurality of electrodes is electrically connected to the control circuit and bonded to the obverse surface of one of the plurality of second leads.

8. The semiconductor device according to claim 7, further comprising a sealing resin covering the semiconductor element, a part of each of the plurality of first leads, and a part of each of the plurality of second leads,
the sealing resin has a bottom surface facing a side which the reverse surfaces face in the thickness direction and a pair of first side surfaces connected to the bottom surface and spaced apart from each other in the first direction,
each of the plurality of first leads includes a main section elongated in the first direction and a pair of side sections connected to opposite ends of the main section in the first direction, each of the pair of side sections has a first end surface connected to a relevant one of the obverse surfaces and a relevant one of the reverse surfaces and facing in the first direction, the reverse surface of each of the plurality of first leads is exposed from the bottom surface, the first end surface of each of the pair of the side sections is exposed from a relevant one of the pair of the first side surfaces to be flush with the first side surface, and in each of the plurality of first leads, a dimension of each of the first end surfaces in the second direction is smaller than a dimension of the reverse surface of the main section in the second direction.

9. The semiconductor device according to claim 8, wherein in at least one of the plurality of first leads, each of the pair of side sections is formed with a constriction extending from the obverse surface to the reverse surface and recessed from opposite edges in the second direction toward an inside of the side section.

10. The semiconductor device according to claim 9, wherein in at least one of the plurality of first leads, each of the pair of side sections is formed with an indentation extending from the obverse surface to the reverse surface and recessed from the first end surface in the first direction, the indentation dividing the first end surface into two sections.

11. The semiconductor device according to claim 8, wherein each of the plurality of second leads has a second end surface connected to the obverse surface and the reverse surface and facing in the second direction, the sealing resin has a pair of second side surfaces connected to the bottom surface and the pair of first side surfaces and spaced apart from each other in the second direction, the reverse surface of each of the plurality of second leads is exposed from the bottom surface, and the second end surface of each of the plurality of second leads is exposed from one of the pair of the second side surfaces to be flush with the second side surface.

12. The semiconductor device according to claim 11, wherein one of the plurality of first leads that is farthest from the plurality of second leads includes a plurality of projections projecting from the main section away from the plurality of second leads in the second direction, each of the plurality of projections has a sub-end surface connected to the obverse surface and the reverse surface and facing in the second direction, and the sub-end surface of each of the plurality of projections is exposed from one of the pair of the second side surfaces to be flush with the second side surface.

* * * * *